(12) United States Patent
Kim et al.

(10) Patent No.: US 12,205,646 B2
(45) Date of Patent: Jan. 21, 2025

(54) METHOD OF OPERATING A MEMORY DEVICE BY PERFORMING A PROGRAM OPERATION USING A COARSE VERIFICATION VOLTAGE AND A FINE VERIFICATION VOLTAGE AND A MEMORY DEVICE AND A MEMORY SYSTEM EMPLOYING THE SAME

(71) Applicant: SAMSUNG ELECTRONICS CO., LTD., Suwon-si (KR)

(72) Inventors: Minseok Kim, Hwaseong-si (KR); Joonsuc Jang, Hwaseong-si (KR); Hyunggon Kim, Hwaseong-si (KR); Seonyong Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/483,088

(22) Filed: Sep. 23, 2021

(65) Prior Publication Data

US 2022/0157381 A1    May 19, 2022

(30) Foreign Application Priority Data

Nov. 17, 2020 (KR) ........................ 10-2020-0154092

(51) Int. Cl.
*G11C 16/10* (2006.01)
*G11C 11/56* (2006.01)
(Continued)

(52) U.S. Cl.
CPC .......... *G11C 16/10* (2013.01); *G11C 11/5628* (2013.01); *G11C 16/24* (2013.01); *G11C 16/3431* (2013.01)

(58) Field of Classification Search
CPC ............ G11C 16/3459; G11C 16/3454; G11C 16/3436; G11C 16/34
See application file for complete search history.

(56) References Cited

U.S. PATENT DOCUMENTS 7,139,198 B2    11/2006 Guterman et al.
7,489,558 B2     2/2009 Choi et al.
(Continued)

FOREIGN PATENT DOCUMENTS

KR         10-0576485           4/2006
KR     10-2012-0118764 A       10/2012
(Continued)

OTHER PUBLICATIONS

European Search Report issued in corresponding EP Patent Application No. 21208342.2 on Mar. 23, 2022.
(Continued)

*Primary Examiner* — Alfredo Bermudez Lozada
(74) *Attorney, Agent, or Firm* — F. CHAU & ASSOCIATES, LLC

(57) ABSTRACT

A method of operating a memory device, the method including: performing a first program operation to form a plurality of first threshold voltage distributions; and performing a second program operation by using a coarse verification voltage and a fine verification voltage based on offset information to form a plurality of second threshold voltage distributions respectively corresponding to a plurality of program states from the plurality of first threshold voltage distributions, wherein the offset information includes a plurality of offsets that vary according to characteristics of the second threshold voltage distributions.

12 Claims, 39 Drawing Sheets

(51) Int. Cl.
*G11C 16/24* (2006.01)
*G11C 16/34* (2006.01)

(56) References Cited

U.S. PATENT DOCUMENTS

| | | | |
|---|---|---|---|
| 7,577,029 B2 | 8/2009 | Pyeon | |
| 7,800,956 B2* | 9/2010 | Lee | G11C 11/5628 |
| | | | 365/185.24 |
| 8,472,245 B2 | 6/2013 | Kim | |
| 8,559,229 B2* | 10/2013 | Kim | G11C 16/0483 |
| | | | 365/185.24 |
| 8,902,666 B2* | 12/2014 | Yoon | G11C 16/10 |
| | | | 365/185.24 |
| 8,934,304 B2 | 1/2015 | Cho | |
| 8,934,305 B2* | 1/2015 | Park | G11C 11/5628 |
| | | | 365/185.24 |
| 9,947,394 B2 | 4/2018 | Yoon | |
| 10,734,085 B2* | 8/2020 | Lee | G11C 16/30 |
| 2006/0050561 A1 | 3/2006 | Guterman et al. | |
| 2017/0125118 A1* | 5/2017 | Lee | G11C 16/3459 |

FOREIGN PATENT DOCUMENTS

| | | |
|---|---|---|
| KR | 10-2013-0007932 A | 1/2013 |
| KR | 10-2017-0053032 A | 5/2017 |
| WO | 2010-030692 | 3/2010 |

OTHER PUBLICATIONS

Office Action issued in Corresponding KR Patent Application No. 10-2020-0154092 on Oct. 28, 2024.

* cited by examiner

FIG. 9A

QLC, 8-16 Shadow Program

Table_1

| M1 | M2 | ... | Mn |
|---|---|---|---|
| OS_DATA1 | OS_DATA2 | ... | OS_DATAn |

FIG. 9B

Table_2

| Vth Distribution | Offset |
|---|---|
| P1 | OS1 |
| P2 | OS2 |
| ⋮ | ⋮ |
| P15 | OS15 | ated on Nov. 17, 2020, in the Korean Intellectual Property Office, the disclosure of which is incorporated by reference herein in its entirety.

METHOD OF OPERATING A MEMORY DEVICE BY PERFORMING A PROGRAM OPERATION USING A COARSE VERIFICATION VOLTAGE AND A FINE VERIFICATION VOLTAGE AND A MEMORY DEVICE AND A MEMORY SYSTEM EMPLOYING THE SAME

CROSS-REFERENCE TO RELATED APPLICATION

This application claims priority under 35 U.S.C. § 119 to Korean Patent Application No. 10-2020-0154092, filed on Nov. 17, 2020, in the Korean Intellectual Property Office, the disclosure of which is incorporated by reference herein in its entirety.

TECHNICAL FIELD

The inventive concept relates to a memory device, and more particularly, to a memory device for performing a program through a plurality of steps, a memory system, and a method of operating the same.

DISCUSSION OF RELATED ART

As data technology advances, huge amounts of data are required to be stored with high reliability. To this end, various program methods are being studied. In an example of the program methods, in a method of multi-step programming, after forming approximate threshold voltage distributions in a first half step, a plurality of target threshold voltage distributions respectively corresponding to a plurality of program states may be formed in a second half step. In the second half step, an offset between a coarse verification voltage and a fine verification voltage used to form the plurality of target threshold voltage distributions is equally set, accordingly, the reliability of a program operation may deteriorate.

SUMMARY

According to an embodiment of the inventive concept, there is provided a method of operating a memory device, the method including: performing a first program operation to form a plurality of first threshold voltage distributions; and performing a second program operation by using a coarse verification voltage and a fine verification voltage based on offset information to form a plurality of second threshold voltage distributions respectively corresponding to a plurality of program states from the plurality of first threshold voltage distributions, wherein the offset information includes a plurality of offsets that vary according to characteristics of the second threshold voltage distributions.

According to an embodiment of the inventive concept, there is provided a memory device including: a memory cell array including a plurality of memory cells; and a control logic controlling a first program operation for the plurality of memory cells to form a plurality of first threshold voltage distributions and controlling a second program operation for the plurality of memory cells to form a plurality of second threshold voltage distributions respectively corresponding to a plurality of program states, wherein the control logic controls the second program operation by using a plurality of offsets between a coarse verification voltage and a fine verification voltage, which vary in accordance with characteristics of the second threshold voltage distributions.

According to an embodiment of the inventive concept, there is provided a memory device including: a memory cell area including a first metal pad; a peripheral circuit area including a second metal pad, wherein the peripheral circuit area is connected to the memory cell area through the first and second metal pads in a direction perpendicular to a substrate in the memory cell area; a memory cell array including a plurality of memory cells configuring a plurality of strings in the direction perpendicular to the substrate in the memory cell area; and a control logic in the peripheral circuit area, the control logic controlling a first program operation for the plurality of memory cells to form a plurality of threshold voltage distributions and controlling a second program operation for the plurality of memory cells to form a plurality of second threshold voltage distributions respectively corresponding to a plurality of program states, and wherein the control logic controls the second program operation by using a plurality of offsets between a coarse verification voltage and a fine verification voltage for the second threshold voltage distributions.

According to an embodiment of the inventive concept, there is provided a memory system including: a plurality of memory devices; and a memory controller controlling operations of the plurality of memory devices, wherein each of the plurality of memory devices forms a plurality of first threshold voltage distributions by performing a first step program operation in response to a program command from the memory controller and forms a plurality of second threshold voltage distributions respectively corresponding to a plurality of program states by performing a second step program operation by using a coarse verification voltage and a fine verification voltage having different offsets in accordance with characteristics of the second threshold voltage distributions.

BRIEF DESCRIPTION OF THE DRAWINGS

Embodiments of the inventive concept will be more clearly understood from the following detailed description taken in conjunction with the accompanying drawings in which:

FIGS. 9A and 9B are table diagrams illustrating offset information according to an embodiment of the inventive concept;

DETAILED DESCRIPTION OF THE EMBODIMENTS

Hereinafter, embodiments of the inventive concept will be described in detail with reference to the accompanying drawings. Hereinafter, embodiments of the inventive concept will be described with reference to NAND flash memory. However, the inventive concept is not limited to NAND flash memory. The inventive concept may be applied to various non-volatile memory devices such as electrically erasable and programmable read only memory (ROM) (EEPROM), a NOR flash memory device, phase-change random access memory (RAM) (PRAM), magnetic RAM (MRAM), resistive RAM (RRAM), and ferroelectric RAM (FRAM).

Figure 1:
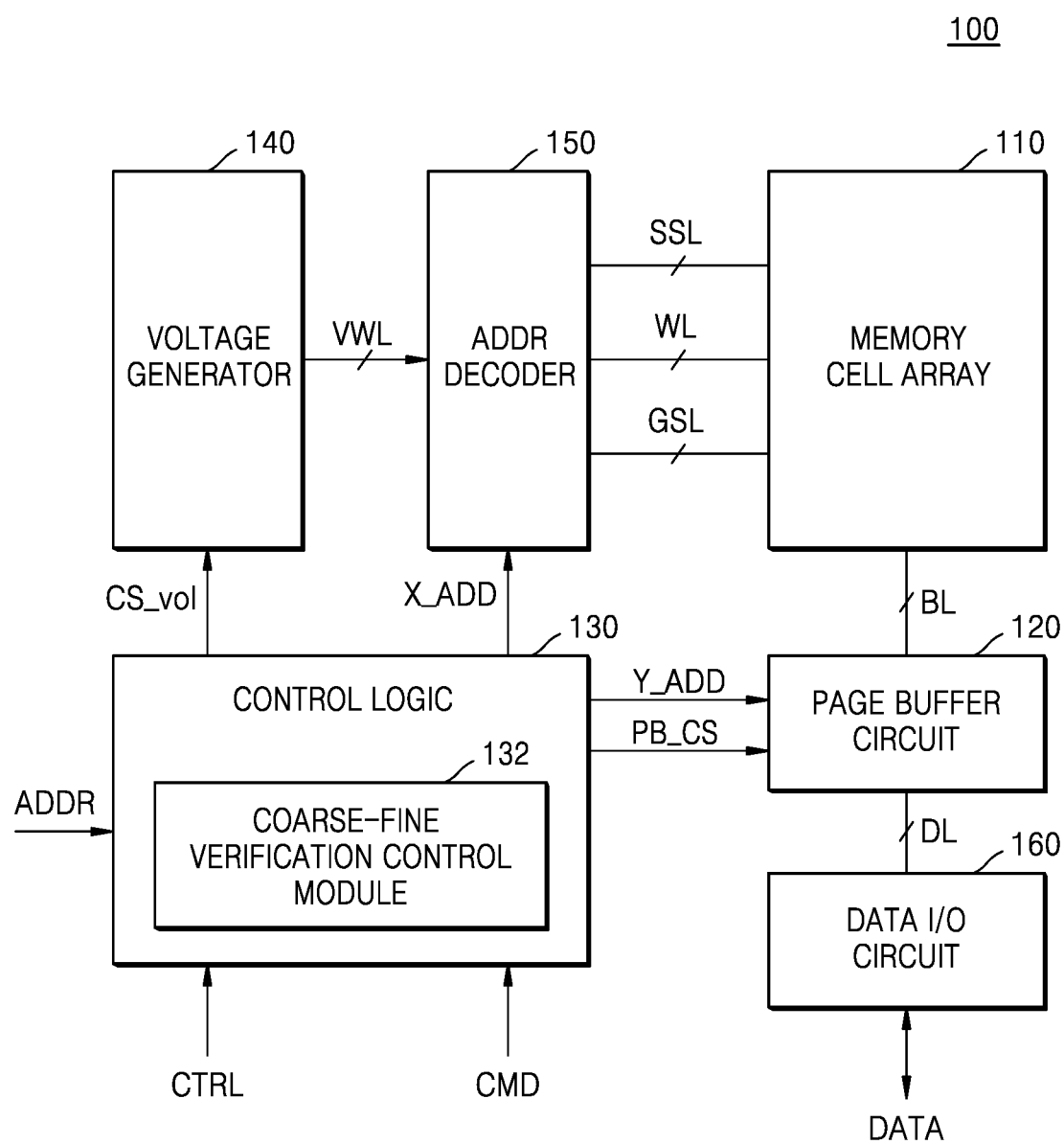
FIG. 1 is a block diagram illustrating a memory device according to an embodiment of the inventive concept.

FIG. 1 is a block diagram illustrating a memory device 100 according to an embodiment of the inventive concept.

Referring to FIG. 1, the memory device 100 may include a memory cell array 110, a page buffer circuit 120, a control logic 130, a voltage generator 140, an address decoder 150, and a data input and output circuit 160. In addition, the control logic 130 may include a coarse-fine verification control module 132 operated according to embodiments of the inventive concept, as described later. The memory device 100 may further include other various function blocks related to a memory operation. The coarse-fine verification control module 132 may be implemented by hardware logic or software logic. In addition, the coarse-fine verification control module 132 may be included in a memory controller.

The memory cell array 110 may include a plurality of strings (or cell strings) arranged on a substrate in rows and columns. Each of the plurality of strings may include a plurality of memory cells stacked in a direction perpendicular to the substrate. In other words, the plurality of memory cells may be stacked in the direction perpendicular to the substrate and may configure a three-dimensional structure. Each of the plurality of memory cells may be of a cell type such as a single level cell, a multilevel cell, a triple level cell, or a quadruple level cell. The inventive concept may be flexibly applied in accordance with each of the various cell types of each of the plurality of memory cells.

According to an embodiment of the inventive concept, as examples of the memory cell array 110, the disclosures of U.S. Pat. Nos. 7,679,133, 8,553,466, 8,654,587, and 8,559,235 and U.S. Patent Publication No. 2011/0233648, which describe a three-dimensional memory cell array that has a plurality of levels and word lines WL and/or bit lines BL are shared among the plurality of levels, are incorporated by reference herein in their entireties. In addition, the disclosures of U.S. Patent Publication Nos. 2012-0051138 and 2011-0204420 are incorporated by reference herein in their entireties.

The plurality of memory cells of the memory cell array 110 may be connected to word lines WL, string selection lines SSL, ground selection lines GSL, and bit lines BL. The memory cell array 110 may be connected to the address decoder 150 through the word lines WL, the string selection lines SSL, and the ground selection lines GSL and may be connected to the page buffer circuit 120 through the bit lines BL.

The page buffer circuit 120 may temporarily store data to be programmed to the memory cell array 110 and read data from the memory cell array 110. The page buffer circuit 120 may include a plurality of page buffers (or a plurality of latch units). For example, each of the plurality of page buffers may include a plurality of latches respectively corresponding to the plurality of bit lines BL and may store data in units of pages. In some embodiments of the inventive concept, the page buffer circuit 120 may include a sensing latch unit and the sensing latch unit may include a plurality of sensing latches respectively corresponding to the plurality of bit lines BL. In addition, each of the plurality of sensing latches may be connected to a sensing node for sensing data through a corresponding bit line.

The control logic 130 may control an overall operation of the memory device 100 and, for example, may output various internal control signals for programming data to the memory cell array 110, reading data from the memory cell array 110, or erasing data stored in the memory cell array 110 based on a command CMD, an address ADDR, and a control signal CTRL received from the memory controller.

The various internal control signals output from the control logic 130 may be provided to the page buffer circuit 120, the voltage generator 140, and the address decoder 150. For example, the control logic 130 may provide a voltage control signal CS_vol to the voltage generator 140. The voltage generator 140 may include one or more pumps and may generate voltages VWL having various levels in accordance with a pumping operation based on the voltage control signal CS_vol. In addition, the control logic 130 may provide a row address X_ADD to the address decoder 150 and may provide, to the page buffer circuit 120, a column address Y_ADD and a page buffer control signal PB_CS for controlling the page buffer circuit 120. Hereinafter, an operation of the coarse-fine verification control module 132 will be described. The control logic 130 may generate internal control signals conforming to the operation of the coarse-fine verification control module 132 and may output the generated internal control signals to the respective function blocks of the memory device 100.

The control logic 130 may control first and second step program operations of the memory device 100 in response to a program command CMD. The first step program operation may let the plurality of memory cells of the memory cell array 110 form a plurality of first threshold voltage distributions. The plurality of first threshold voltage distributions, which are approximately formed before the second step program operation is performed, may be referred to as a plurality of approximate threshold voltage distributions. The second step program operation may let the plurality of memory cells form the plurality of second threshold voltage distributions respectively corresponding to the plurality of program states subsequent to the first step program operation. The plurality of second threshold voltage distributions, which are correctly formed to distinguish a program state, may be referred to as a plurality of target threshold voltage distributions. For example, a number of the approximate threshold voltage distributions resulting from the first step program operation may be different from or equal to a number of the target threshold voltage distributions resulting from the second step program operation. For example, when the number of approximate threshold voltage distributions is 8 and the number of target threshold voltage distributions is 16, the first and second step program operations may be referred to as '8-16' step program operations. In another example, when the number of approximate threshold voltage distributions is 16 and the number of target threshold voltage distributions is 16, the first and second step program operations may be referred to as '16-16' step program operations.

According to an embodiment of the inventive concept, the second step program operation may include a program loop, a coarse verification operation, and a fine verification operation. The memory device 100 may repeat the program loop until the plurality of memory cells form the plurality of target threshold voltage distributions through the coarse verification operation and the fine verification operation in the second step program operation. For example, in the second step program operation, among memory cells included in a predetermined threshold voltage distribution, memory cells having a threshold voltage of no less than a coarse verification voltage pass the coarse verification operation and the program loop may be repeated for memory cells having a threshold voltage less than the coarse verification voltage. In other words, memory cells with a threshold voltage greater than the coarse verification voltage pass the coarse verification operation, while memory cells having a threshold voltage less than the coarse verification voltage fail and thus the program loop is repeated for the failing memory cells. When all the memory cells included in the predetermined threshold voltage distribution pass the coarse verification operation, the fine verification operation is performed thereon, and memory cells having a threshold voltage of no less than a fine verification voltage pass the fine verification operation and the program loop may be repeated for memory cells having a threshold voltage less than the fine verification voltage. Therefore, in the second step program operation, the predetermined threshold voltage distribution may move to a target threshold voltage distribution. For example, a level of the coarse verification voltage used for the coarse verification operation and a level of the fine verification voltage used for the fine verification operation may vary in accordance with a program state to be verified.

According to an embodiment of the inventive concept, the coarse-fine verification control module 132 may control the coarse verification operation and the fine verification operation included in the second step program operation. The operation of the coarse-fine verification control module 132, as described hereinafter, may be referred to as an operation of the control logic 130. The coarse-fine verification control module 132 may control the coarse verification operation and the fine verification operation by using the coarse verification voltage and the fine verification voltage based on offset information including a plurality of offsets in accordance with characteristics by target threshold voltage distribution.

The offset may be a difference between the coarse verification voltage and the fine verification voltage and may refer to a level difference between the coarse verification voltage and the fine verification voltage or a length difference between a first develop interval using the coarse verification voltage and a second develop interval using the fine verification voltage. In the first or second develop interval, a voltage of a sensing node corresponding to a bit line connected to a corresponding memory cell in the page buffer circuit 120 is developed from a predetermined precharge voltage to verify a program state of the memory cell.

The characteristics by target threshold voltage distribution may be referred to as estimated moving distances through the second step program operation from the plurality of approximate threshold voltage distributions formed through the first step program operation in a direction in which a threshold voltage increases. For example, the target threshold voltage distributions may include first and second target threshold voltage distributions and, in the second target threshold voltage distribution, an estimated moving distance through the second step program operation may be greater than that in the first target threshold voltage distribution. In this case, an offset between the coarse verification voltage and the fine verification voltage for forming the second target threshold voltage distribution may be greater than an offset between the coarse verification voltage and the fine verification voltage for forming the first target threshold voltage distribution. In some embodiments of the inventive concept, the characteristics by target threshold voltage distribution may be referred to as distribution speeds of the plurality of target threshold voltage distributions in the second step program operation. For example, a distribution speed of the second target threshold voltage distribution may be greater than a distribution speed of the first target threshold voltage distribution in the second step program operation. In this case, the offset between the coarse verification voltage and the fine verification voltage for forming the second target threshold voltage distribution may be greater than the offset between the coarse verification voltage and the fine verification voltage for forming the first target threshold voltage distribution.

According to an embodiment of the inventive concept, the coarse-fine verification control module 132 may control the coarse verification operation and the fine verification operation by using the coarse verification voltage and the fine verification voltage having a previously determined offset by target threshold voltage distribution with reference to the offset information. According to an embodiment of the inventive concept, the offset information may be stored in a predetermined region of the memory cell array 110 or an electronic fuse circuit included in the memory device 100. Specific embodiments of the offset information will be described later.

In addition, according to an embodiment of the inventive concept, the offset information may include offsets respectively corresponding to a plurality of program methods. The control logic 130 may control the first and second step program operations based on a program method selected from the plurality of program methods. The program method may vary in accordance with a cell type of a memory cell in accordance with the number of bits of program data and a program sequence for memory cells. According to an embodiment of the inventive concept, the coarse-fine verification control module 132 may control the coarse verification operation and the fine verification operation by obtaining offsets corresponding to program methods applied to the current first and second step program operations from the offset information. According to an embodiment of the inventive concept, the offset information may be previously generated in a process of mass producing or testing the memory device 100.

The memory device 100 according to an embodiment of the inventive concept may increase intervals among the target threshold voltage distributions as much as possible by performing the coarse verification operation and the fine verification operation considering the characteristics by target threshold voltage distribution in the second step program operation. As a result, the memory device 100 may guarantee increased data reliability.

Figure 2A:
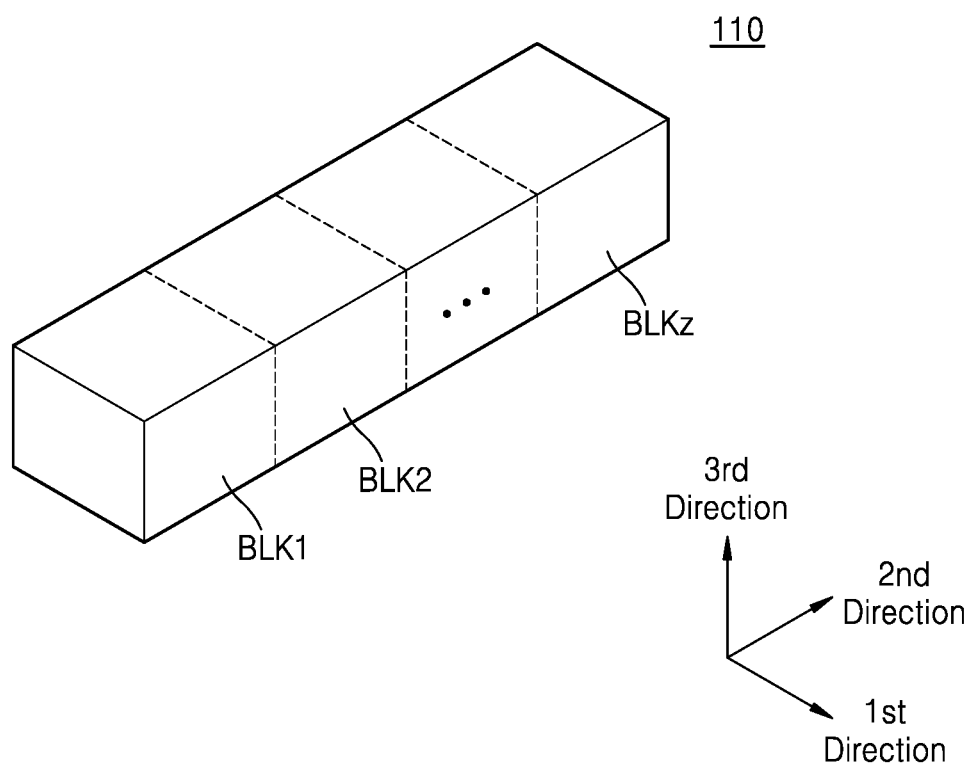
FIG. 2A is a diagram illustrating the memory cell array of FIG. 1.
Figure 2B:
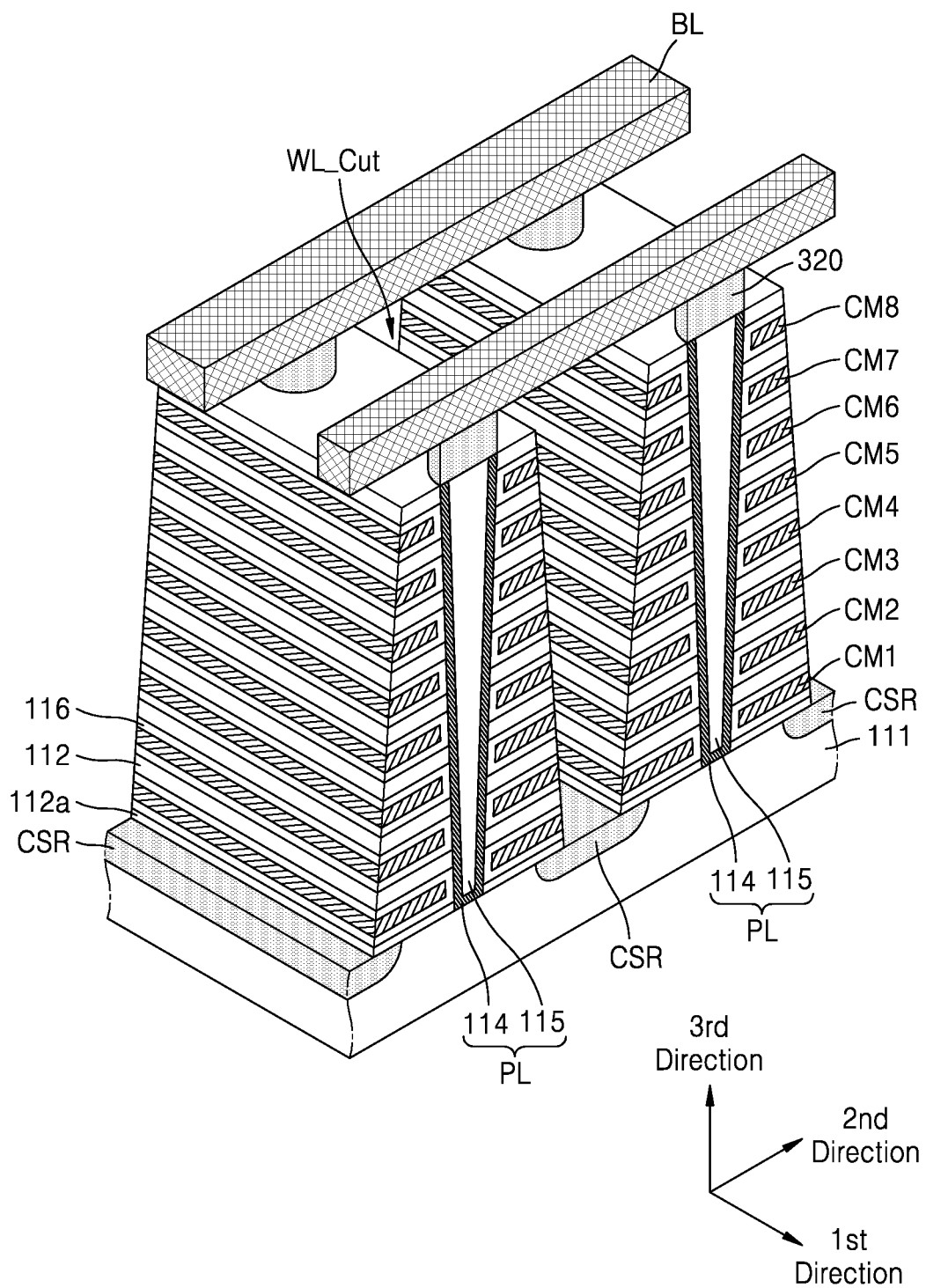
FIG. 2B is a perspective view of the memory cell array of FIG. 1.
Figure 2C:
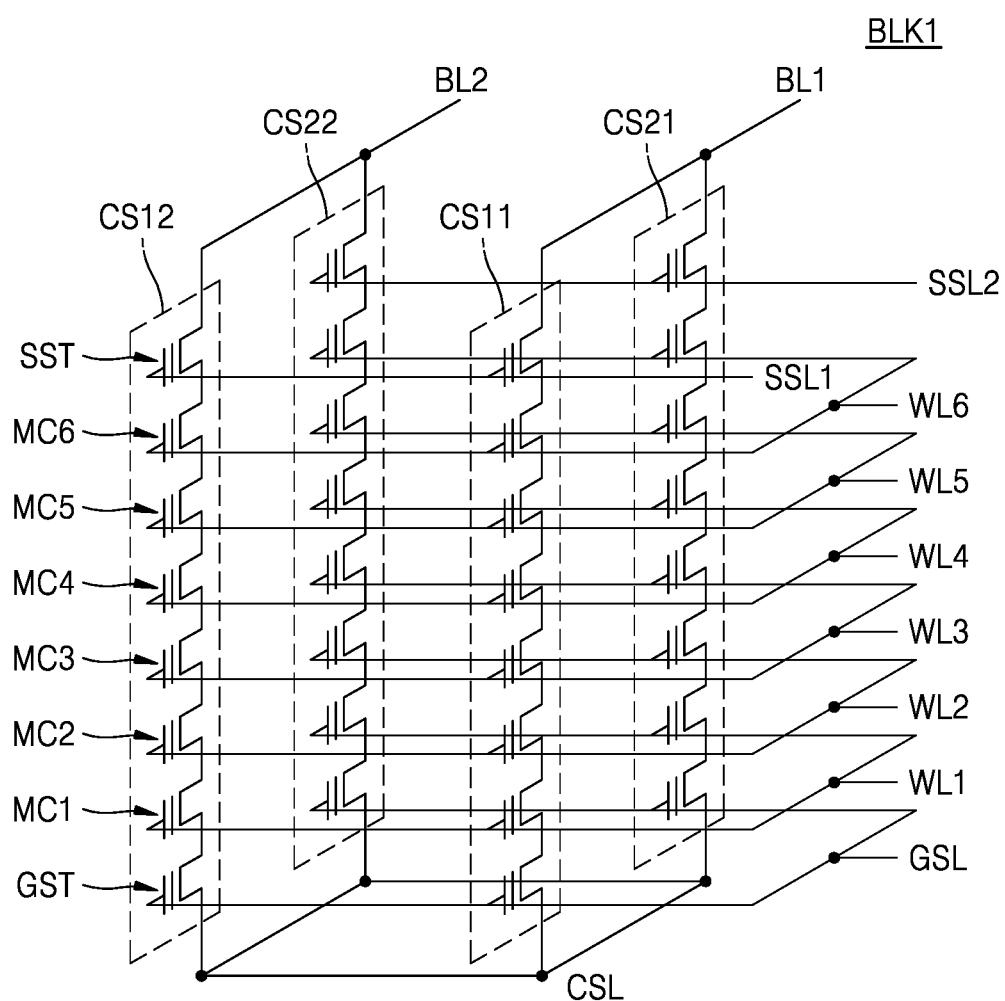
FIG. 2C is a view illustrating an equivalent circuit of a first memory block of FIG. 2A.

FIG. 2A is a diagram illustrating the memory cell array 110 of FIG. 1, FIG. 2B is a perspective view of the memory cell array 110 of FIG. 1, and FIG. 2C is a view illustrating an equivalent circuit of a first memory block BLK1 of FIG. 2A.

Referring to FIGS. 1 and 2A, the memory cell array 110 may include a plurality of memory blocks BLK1 to BLKz. Each of the plurality of memory blocks BLK1 to BLKz may have a three-dimensional structure (or a vertical structure). For example, each of the plurality of memory blocks BLK1 to BLKz may include structures extending in first to third directions. Each of the plurality of memory blocks BLK1 to BLKz may include a plurality of cell strings extending in the second direction. The plurality of cell strings may be apart from one another in the first and third directions. Cell strings of one memory block are connected to a plurality of bit lines BL, a plurality of string selection lines SSL, a plurality of word lines WL, one ground selection line or a plurality of ground selection lines GSL, and a common source line. The cell strings of the plurality of memory blocks BLK1 to BLKz may share the plurality of bit lines BL. For example, the plurality of bit lines BL may extend in the second direction and may be shared by the plurality of memory blocks BLK1 to BLKz.

The plurality of memory blocks BLK1 to BLKz may be selected by the address decoder 150 illustrated in FIG. 1. For example, the address decoder 150 may select a memory block corresponding to the received address ADDR among the plurality of memory blocks BLK1 to BLKz. Programming, reading, and erasing may be performed by the selected memory block. In addition, the first and second step program operations according to embodiments of the inventive concept may be performed by the selected memory block; however, this is merely an example. For example, the inventive concept is not limited thereto, and thus, the first and second step program operations may be performed in units of memory sub-blocks or predetermined memory groups.

Referring to FIG. 2B further, a substrate 111 is provided. The substrate 111 may be a first conductive-type well. In the substrate 111, a plurality of common source regions CSR extending in the first direction and apart from one another in the second direction may be provided. The plurality of common source regions CSR may be commonly connected to configure a common source line. The plurality of common source regions CSR have a second conductive type that is different from the first conductive type of the substrate 111.

Between two adjacent common source regions of the plurality of common source regions CSR, a plurality of insulating materials 112 and 112a may be sequentially provided on the substrate 111 in the third direction (e.g., perpendicular to the substrate 111). The plurality of insulating materials 112 and 112a may be apart from one another in the third direction. The plurality of insulating materials 112 and 112a may extend in the first direction.

Between the two adjacent common source regions, a plurality of pillars PL sequentially arranged in the first direction and passing through the plurality of insulating materials 112 and 112a in the second direction may be provided. The plurality of pillars PL may contact the substrate 111 through the plurality of insulating materials 112 and 112a. Between the two adjacent common source regions, the plurality of pillars PL may be apart from one another in the first direction. The plurality of pillars PL may be arranged in line in the first direction.

The plurality of pillars PL may include a plurality of materials. For example, the plurality of pillars PL may include channel layers 114 and internal materials 115. The channel layers 114 may include a first conductive-type semiconductor material (for example, silicon). The channel layers 114 may include a semiconductor material (for example, silicon) having the same conductive type as that of the substrate 111. The channel layers 114 may include an intrinsic semiconductor that does not have a conductive type.

The internal materials 115 may include an insulating material. For example, the internal materials 115 may include an insulating material such as silicon oxide. For example, the internal materials 115 may include an air gap. Between the two adjacent common source regions, information storage layers 116 may be provided on exposed surfaces of the plurality of insulating materials 112 and 112a and the plurality of pillars PL. The information storage layers 116 may store information by capturing or draining charges.

Between the two adjacent common source regions and among the plurality of insulating materials 112 and 112a, first, second, third, fourth, fifth, sixth, seventh and eighth conductive materials CM1, CM2, CM3, CM4, CM5, CM6, CM7 and CM8 are provided on exposed surfaces of the information storage layers 116. The first to eighth conductive materials CM1 to CM8 may extend in the first direction. On the plurality of common source regions CSR, the first to eighth conductive materials CM1 to CM8 may be separated by word line cuts WL_Cut. The word line cuts WL_Cut may expose the plurality of common source regions CSR. The word line cuts WL_Cut may extend in the first direction. The first to eighth conductive materials CM1 to CM8 may include a metallic conductive material. The first to eighth conductive materials CM1 toy CM8 may include a non-metallic conductive material such as polysilicon.

The information storage layers 116 provided on an upper surface of the insulating material in the uppermost portion of the plurality of insulating materials 112 and 112a may be removed. The information storage layers 116 provided on a side surface facing the plurality of pillars PL among side surfaces of the plurality of insulating materials 112 and 112a may be removed.

A plurality of drains 320 may be provided on the plurality of pillars PL. The plurality of drains 320 may include a second conductive-type semiconductor material (for example, silicon). For example, the plurality of drains 320 may include an N conductive-type semiconductor material (for example, silicon).

On the plurality of drains 320, the plurality of bit lines BL extending in the second direction and apart from one another in the first direction may be provided. The plurality of bit lines BL are connected to the plurality of drains 320. The plurality of drains 320 may be connected to the plurality of bit lines BL through contact plugs. First and second bit lines BL1 and BL2 (see FIG. 2C or BL in FIG. 2B) may include metallic conductive materials. The first and second bit lines BL1 and BL2 may include non-metallic conductive materials such as polysilicon. The first to eighth conductive materials CM1 to CM8 may have first to eighth heights in this order from the substrate 111.

The plurality of pillars PL may form the plurality of strings together with the information storage layers 116 and the first to eighth conductive materials CM1 to CM8. Each of the plurality of pillars PL may configure one string together with the information storage layers 116 and adjacent conductive materials of the first to eighth conductive materials CM1 to CM8. On the substrate 111, the plurality of pillars PL may be provided in rows and columns. The eighth conductive material CM8 may configure rows. Pillars connected to the same eighth conductive material may configure one row. The plurality of bit lines BL may configure columns. Pillars connected to the same bit line may configure one column. The plurality of pillars PL configure the plurality of strings arranged in rows and columns together with the information storage layers 116 and the first to eighth conductive materials CM1 to CM8. Each of the plurality of strings may include a plurality of cell transistors (or memory cells) stacked in a direction perpendicular to the substrate 111.

Referring to FIG. 2C, cell strings CS11, CS12, CS21, and CS22 may be between the first and second bit lines BL1 and BL2 and a common source line CSL. The cell strings CS11 and CS21 may be connected between the first bit line BL1 and the common source line CSL. The cell strings CS12 and CS22 may be connected between the second bit line BL2 and the common source line CSL. The plurality of common source regions CSR (refer to FIG. 2B) may be commonly connected and may configure the common source line CSL.

Memory cells with the same height are commonly connected to one word line and, when a voltage is supplied to a word line with a specific height, the voltage may be supplied to all the strings CS11, CS12, CS21, and CS22. Strings in different rows may be respectively connected to first and second string selection lines SSL1 and SSL2. By selecting or not selecting the first and second string selection lines SSL1 and SSL2, the strings CS11, CS12, CS21, and CS22 may be selected or may not be selected in units of rows. For example, the strings CS11 and CS12 or CS21 and CS22 connected to the string selection line SSL1 or SSL2 that is not selected may be electrically separated from the first and second bit lines BL1 and BL2. The strings CS21 and CS22 or CS11 and CS12 connected to the selected string selection line SSL2 or SSL1 may be electrically connected to the first and second bit lines BL1 and BL2.

The strings CS11, CS12, CS21, and CS22 may be connected to the first and second bit lines BL1 and BL2 in units of columns. The strings CS11 and CS21 may be connected to the first bit line BL1 and the strings CS12 and CS22 may be connected to the second bit line BL2. By selecting or not selecting the first and second bit lines BL1 and BL2, the strings CS11, CS12, CS21, and CS22 may be selected or may not be selected in units of columns.

The first memory block BLK1 may further include a plurality of memory cells MC1 to MC6 respectively connected to a plurality of word lines WL1 to WL6, a ground selection transistor GST connected to a ground selection line GSL and a string selection transistor SST connected to one of the first or second string selection lines SSL1 and SSL2.

Figure 3:
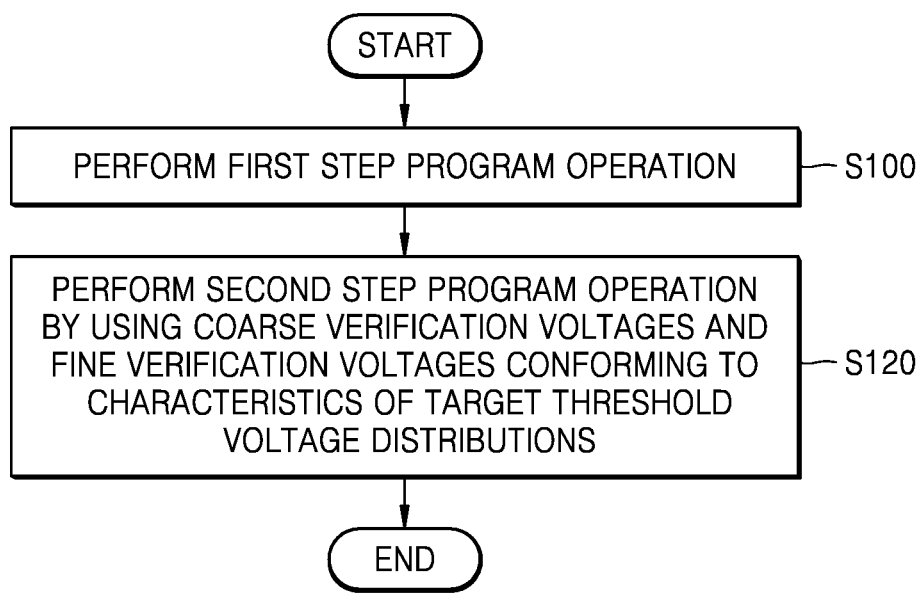
FIG. 3 is a flowchart illustrating a method of operating a memory device, according to an embodiment of the inventive concept.

FIG. 3 is a flowchart illustrating a method of operating a memory device, according to an embodiment of the inventive concept.

Referring to FIG. 3, in operation S100, the memory device may perform a first step program operation on a plurality of memory cells. The memory device may form a plurality of approximate threshold voltage distributions through the first step program operation. In operation S120, the memory device may perform a second step program operation on a plurality of memory cells by using a coarse verification voltage and a fine verification voltage conforming to characteristics of target threshold voltage distributions. For example, the target threshold voltage distributions include first and second target threshold voltage distributions and, when characteristics of the first target threshold voltage distribution are different from characteristics of the second target threshold voltage distribution, the memory device may control an offset between a coarse verification voltage and a fine verification voltage used for forming the first target threshold voltage distribution to be different from an offset between a coarse verification voltage and a fine verification voltage used for forming the second target threshold voltage distribution.

Figure 4A:
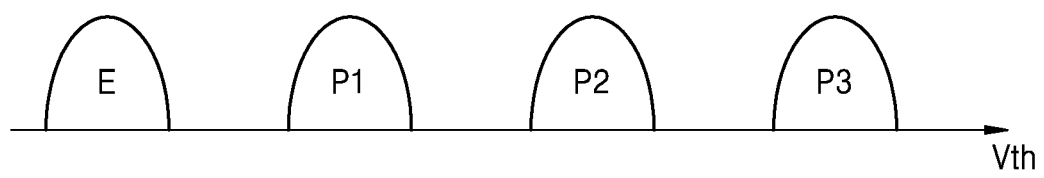
FIGS. 4A, 4B and 4C are views illustrating various program methods based on memory cell types according to embodiments of the inventive concept.
Figure 4B:
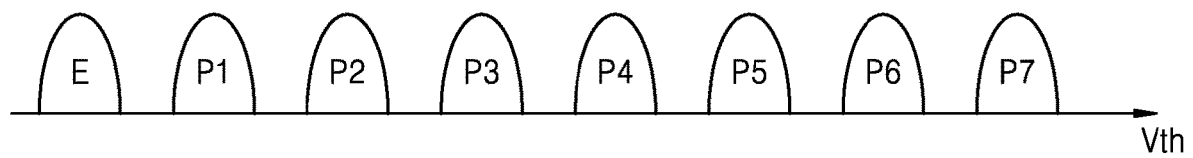
Figure 4C:
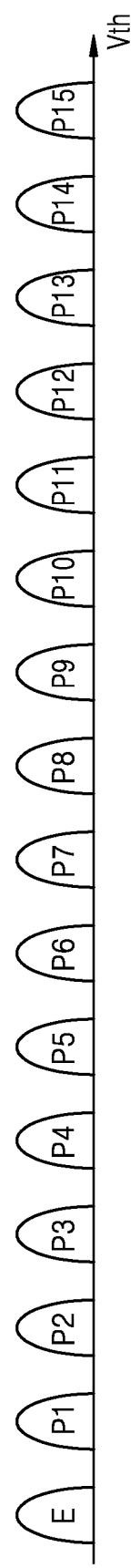

FIGS. 4A to 4C are views illustrating various program methods based on memory cell types according to embodiments of the inventive concept.

Referring to FIG. 4A, when a memory cell type is a multilevel cell, memory cells may form a target threshold voltage distribution E corresponding to an erase state and target threshold voltage distributions P1 to P3 respectively corresponding to first to third program states as a result of performing first and second step program operations according to embodiments of the inventive concept.

Referring to FIG. 4B, when a memory cell type is a triple level cell, memory cells may form a target threshold voltage distribution E corresponding to an erase state and target threshold voltage distributions P1 to P7 respectively corresponding to first to seventh program states as a result of performing first and second step program operations according to embodiments of the inventive concept.

Referring to FIG. 4C, when a memory cell type is a quadruple level cell, memory cells may form a target threshold voltage distribution E corresponding to an erase state and target threshold voltage distributions P1 to P15 respectively corresponding to first to fifteenth program states as a result of performing first and second step program operations according to embodiments of the inventive concept.

The embodiments illustrated in FIGS. 4A to 4C are merely examples, and thus, the inventive concept is not limited thereto and may also be applied to various memory cell types that are not illustrated in FIGS. 4A to 4C.

Figure 5A:
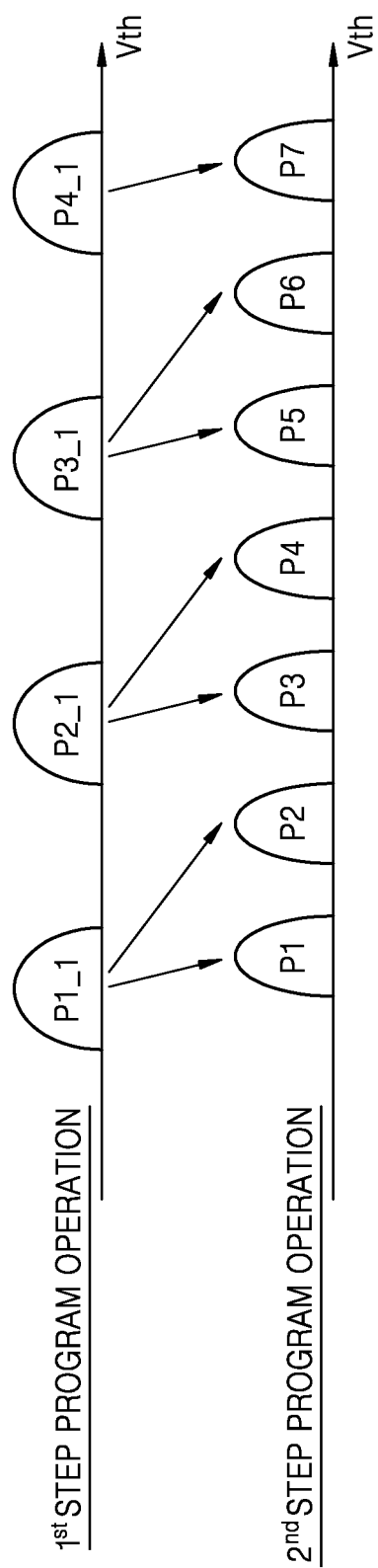
FIGS. 5A and 5B are views illustrating a program method of first and second step program operations of a memory device according to an embodiment of the inventive concept.
Figure 5B:
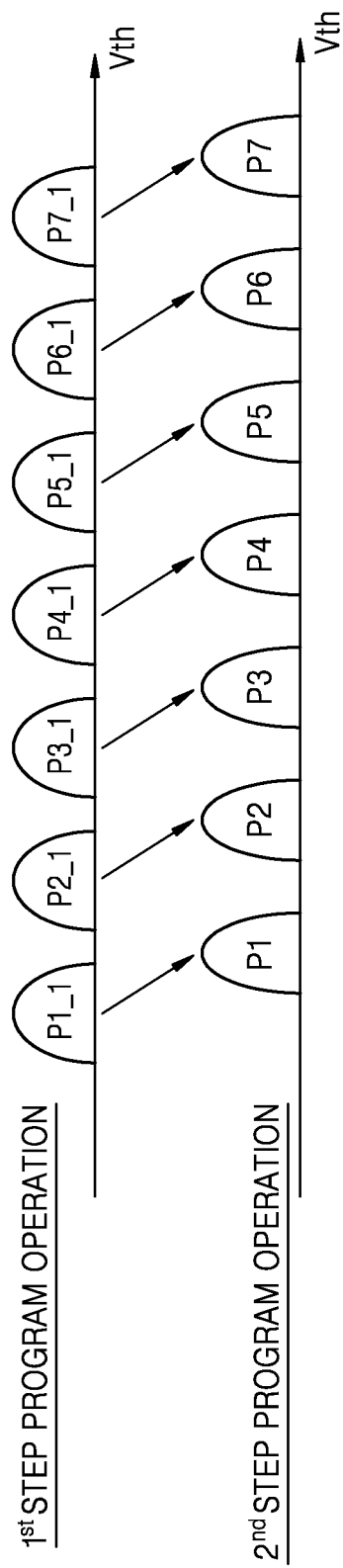

FIGS. 5A and 5B are views illustrating a program method of first and second step program operations of a memory device according to an embodiment of the inventive concept. Hereinafter, for convenience sake, a threshold voltage distribution corresponding to an erase state is omitted and it is premised that a memory cell type is a triple level cell, for ease of understanding. Embodiments of the inventive concept are not limited thereto.

Referring to FIG. 5A, the memory device may form first to fourth approximate threshold voltage distributions P1_1 to P4_1 by performing the first step program operation on memory cells. The memory device may form first to seventh target threshold voltage distributions P1 to P7 by performing the second step program operation on the memory cells subsequent to the first step program operation. For example, the first and second target threshold voltage distributions P1 and P2 may be moved from the first approximate threshold voltage distribution P1_1. The third and fourth target threshold voltage distributions P3 and P4 may be moved from the second approximate threshold voltage distribution P2_1. The fifth and sixth target threshold voltage distributions P5 and P6 may be moved from the third approximate threshold voltage distribution P3_1. The seventh target threshold voltage distribution P7 may be moved from the fourth approximate threshold voltage distribution P4_1.

According to an embodiment of the inventive concept, characteristics of the second, fourth, and sixth target threshold voltage distributions P2, P4, and P6 respectively corresponding to even program states may be different from characteristics of the first, third, fifth, and seventh target threshold voltage distributions P1, P3, P5, and P7 respectively corresponding to odd program stages. For example, the movement distance of the second target threshold voltage distribution P2 from the first approximate threshold voltage distribution P1_1 may be greater than the movement distance of the first target threshold voltage distribution P1 from the first approximate threshold voltage distribution P1_1. In addition, a distribution speed of the second target threshold voltage distribution P2 may be greater than a distribution speed of the first target threshold voltage distribution P1. The movement distance may be a distance between the minimum threshold voltage or the maximum threshold voltage of an approximate threshold voltage distribution and the minimum threshold voltage or the maximum threshold voltage of a target threshold voltage distribution. The minimum threshold voltage of the first approximate threshold voltage distribution P1_1 may refer to the leftmost side of the first approximate threshold voltage distribution P1_1, and the maximum threshold voltage of the first approximate threshold voltage distribution P1_1 may refer to the rightmost side of the first approximate threshold voltage distribution P1_1.

According to an embodiment of the inventive concept, the memory device may control a coarse verification voltage and a fine verification voltage so that a first offset for forming the second, fourth, and sixth target threshold voltage distributions P2, P4, and P6 is greater than a second offset for forming the first, third, fifth, and seventh target threshold voltage distributions P1, P3, P5, and P7. In other words, the memory device may form the second, fourth, and sixth target threshold voltage distributions P2, P4, and P6 by using the coarse verification voltage and the fine verification voltage having the first offset considering fast distribution characteristics or long estimated movement distances of the second, fourth, and sixth target threshold voltage distributions P2, P4, and P6. The memory device may form the first, third, fifth, and seventh target threshold voltage distributions P1, P3, P5, and P7 by using the coarse verification voltage and the fine verification voltage having the second offset considering slow distribution characteristics or short estimated movement distances of the first, third, fifth, and seventh target threshold voltage distributions P1, P3, P5, and P7.

Referring to FIG. 5B, the memory device may form first to seventh approximate threshold voltage distributions P1_1 to P7_1 by performing the first step program operation on memory cells. The memory device may form first to seventh target threshold voltage distributions P1 to P7 by performing the second step program operation on the memory cells subsequent to the first step program operation. For example, the first to seventh target threshold voltage distributions P1 to P7 may be moved from the first to seventh approximate threshold voltage distributions P1_1 to P7_1.

According to an embodiment of the inventive concept, characteristics of some of the first to seventh target threshold voltage distributions P1 to P7 may be the same as one another and characteristics of the other ones of the first to seventh target threshold voltage distributions P1 to P7 may be different from one another. For example, the first and second target threshold voltage distributions P1 and P2 may have the same characteristics and the third target threshold voltage distribution P3 may have difference characteristics from the first and second target threshold voltage distributions P1 and P2. The second step program operation may be performed considering the characteristics of the first to seventh target threshold voltage distributions P1 to P7, which are different from or the same as one another.

Figure 6A:
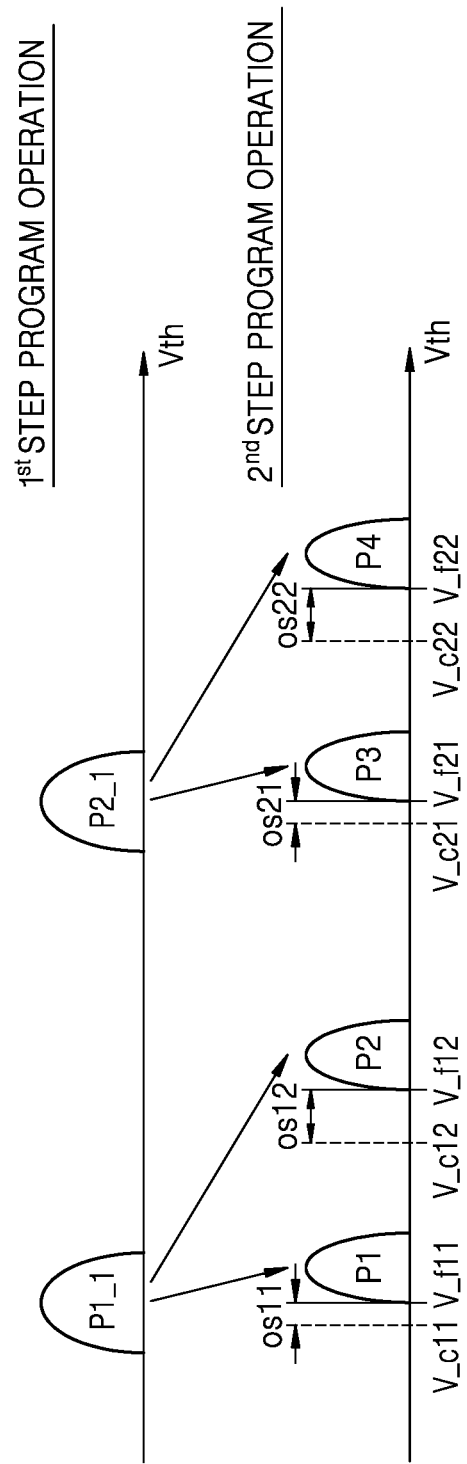
FIGS. 6A and 6B are views illustrating first and second step program operations of a memory device according to an embodiment of the inventive concept.
Figure 6B:
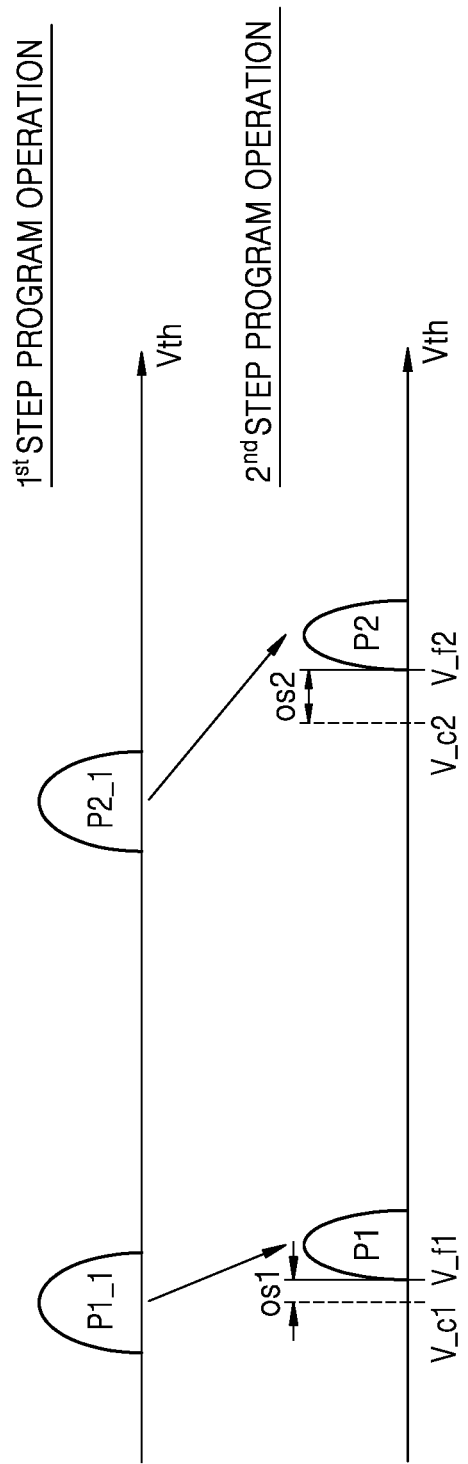

FIGS. 6A and 6B are views illustrating first and second step program operations of a memory device according to an embodiment of the inventive concept. Hereinafter, for convenience sake, only some of a plurality of target threshold voltage distributions are illustrated and described. In addition, a description hereinafter is an example for describing the inventive concept and the inventive concept is not limited thereto. FIG. 6A corresponds to the embodiment described with reference to FIG. 5A and FIG. 6B corresponds to the embodiment described with reference to FIG. 5B. Hereinafter, a description previously given with reference to FIGS. 5A and 5B may be omitted.

Referring to FIG. 6A, a memory device may form a first target threshold voltage distribution P1 from a first approximate threshold voltage distribution P1_1 by performing a second step program operation using a coarse verification voltage V_c11 having a first level and a fine verification voltage V_f11 having a second level. An offset os11 between the coarse verification voltage V_c11 and the fine verification voltage V_f11 used for forming the first target threshold voltage distribution P1 may be referred as a first offset. The memory device may form a second target threshold voltage distribution P2 from the first approximate threshold voltage distribution P1_1 by performing the second step program operation using a coarse verification voltage V_c12 having a third level and a fine verification voltage V_f12 having a fourth level. An offset os12 between the coarse verification voltage V_c12 and the fine verification voltage V_f12 used for forming the second target threshold voltage distribution P2 may be referred as a second offset. According to an embodiment of the inventive concept, the second offset os12 may be greater than the first offset os11, which may be a result obtained by considering a characteristic in which the second target threshold voltage distribution P2 has a faster distribution or a longer estimated movement distance than the first target threshold voltage distribution P1 in the second step program operation. This is an example embodiment, and the inventive invention is not limited thereto. For example, the first offset os11 may be greater than the second offset os12 in accordance with characteristics by target threshold voltage distributions.

The memory device may form a third target threshold voltage distribution P3 from a second approximate threshold voltage distribution P2_1 by performing the second step program operation using a coarse verification voltage V_c21 having a fifth level and a fine verification voltage V_f21 having a sixth level. An offset os21 between the coarse verification voltage V_c21 and the fine verification voltage V_f21 used for forming the third target threshold voltage distribution P3 may be referred as a third offset. The memory device may form a fourth target threshold voltage distribution P4 from the second approximate threshold voltage distribution P2_1 by performing the second step program operation using a coarse verification voltage V_c22 having a seventh level and a fine verification voltage V_f22 having an eighth level. An offset os22 between the coarse verification voltage V_c22 and the fine verification voltage V_f22 used for forming the fourth target threshold voltage distribution P4 may be referred as a fourth offset. According to an embodiment of the inventive concept, the fourth offset os22 may be greater than the third offset os21, which may be a result obtained by considering a characteristic in which the fourth target threshold voltage distribution P4 has a faster distribution or a longer estimated movement distance than the third target threshold voltage distribution P3 in the second step program operation. This is an example embodiment, and the inventive invention is not limited thereto. For example, the third offset os21 may be greater than the fourth offset os22 in accordance with characteristics by target threshold voltage distributions.

According to an embodiment of the inventive concept, the first and third offsets os11 and os21 may be the same as or similar to each other and the second and fourth offsets os12 and os22 may be the same as or similar to each other. In addition, it is illustrated in FIG. 6A that the first to fourth offsets os11, os12, os21, and os22 correspond to a level difference between the coarse verification voltage and the fine verification voltage. However, the inventive concept is not limited thereto, and the first to fourth offsets os11, os12, os21, and os22 may correspond to a length difference between a develop interval using the coarse verification voltage and a develop interval using the fine verification voltage.

Referring to FIG. 6B, a memory device may form a first target threshold voltage distribution P1 from a first approximate threshold voltage distribution P1_1 by performing a second step program operation using a coarse verification voltage V_c1 having a first level and a fine verification voltage V_f1 having a second level. An offset os1 between the coarse verification voltage V_c1 and the fine verification voltage V_f1 used for forming the first target threshold voltage distribution P1 may be referred as a first offset. The memory device may form a second target threshold voltage distribution P2 from a second approximate threshold voltage distribution P2_1 by performing the second step program operation using a coarse verification voltage V_c2 having a third level and a fine verification voltage V_f2 having a fourth level. An offset os2 between the coarse verification voltage V_c2 and the fine verification voltage V_f2 used for forming the second target threshold voltage distribution P2 may be referred as a second offset. According to an embodiment of the inventive concept, the second offset os2 may be greater than the first offset os1, which may be a result obtained by considering a characteristic in which the second target threshold voltage distribution P2 has a faster distribution or a longer estimated movement distance than the first target threshold voltage distribution P1 in the second step program operation. This is an example embodiment, and the inventive invention is not limited thereto. For example, the first offset os1 may be greater than the second offset os2 in accordance with characteristics by target threshold voltage distributions.

Figure 7A:
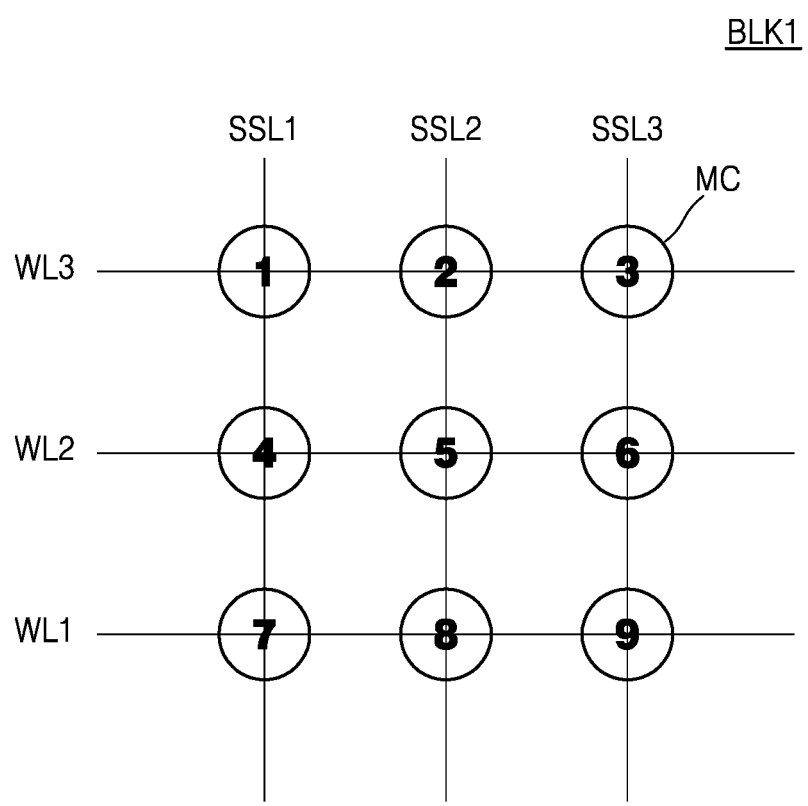
FIGS. 7A and 7B are views illustrating a program method in accordance with a program sequence among various program methods according to embodiments of the inventive concept.
Figure 7B:
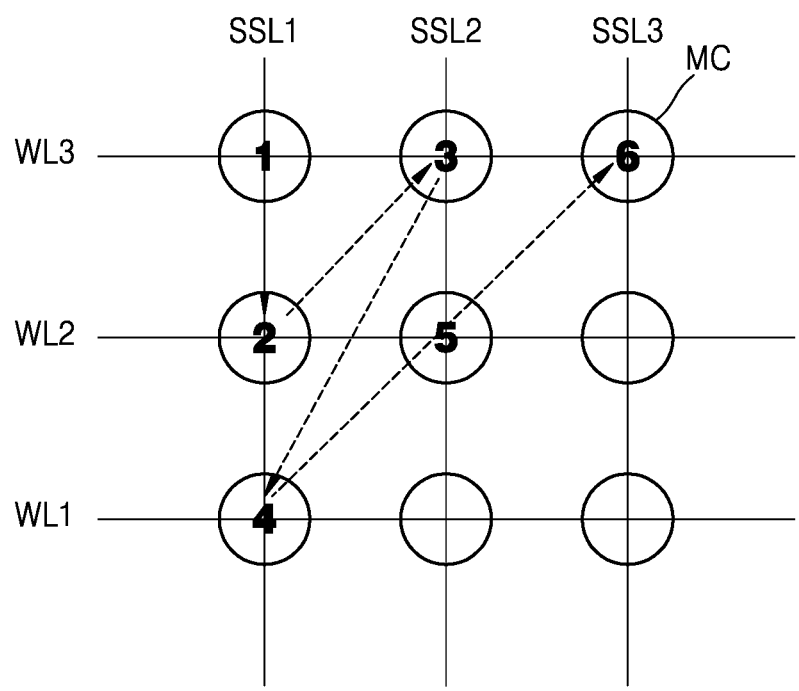
Figure 7C:
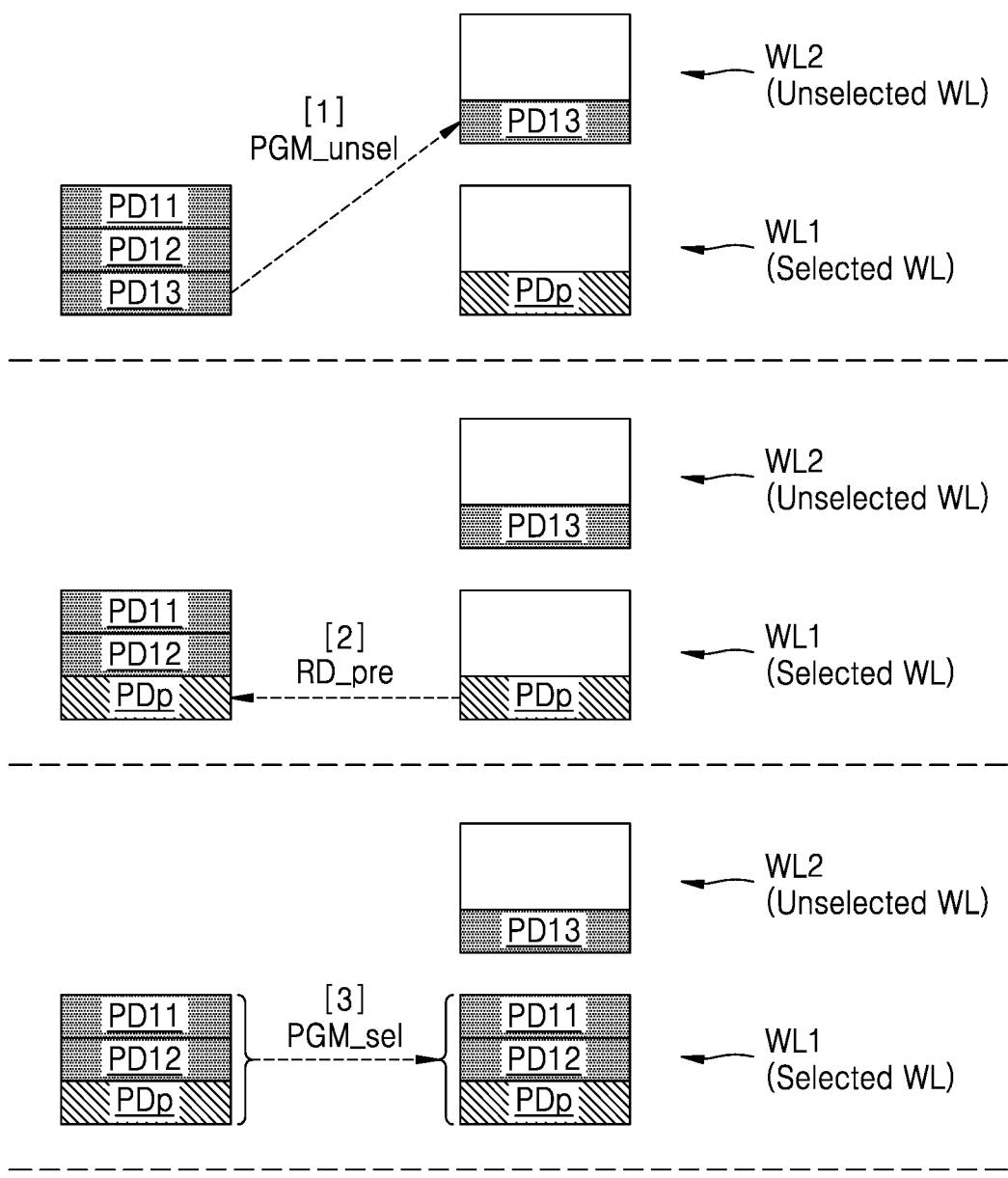
FIGS. 7C and 7D are views illustrating a high speed program (HSP) method among various program methods according to embodiments of the inventive concept.
Figure 7D:
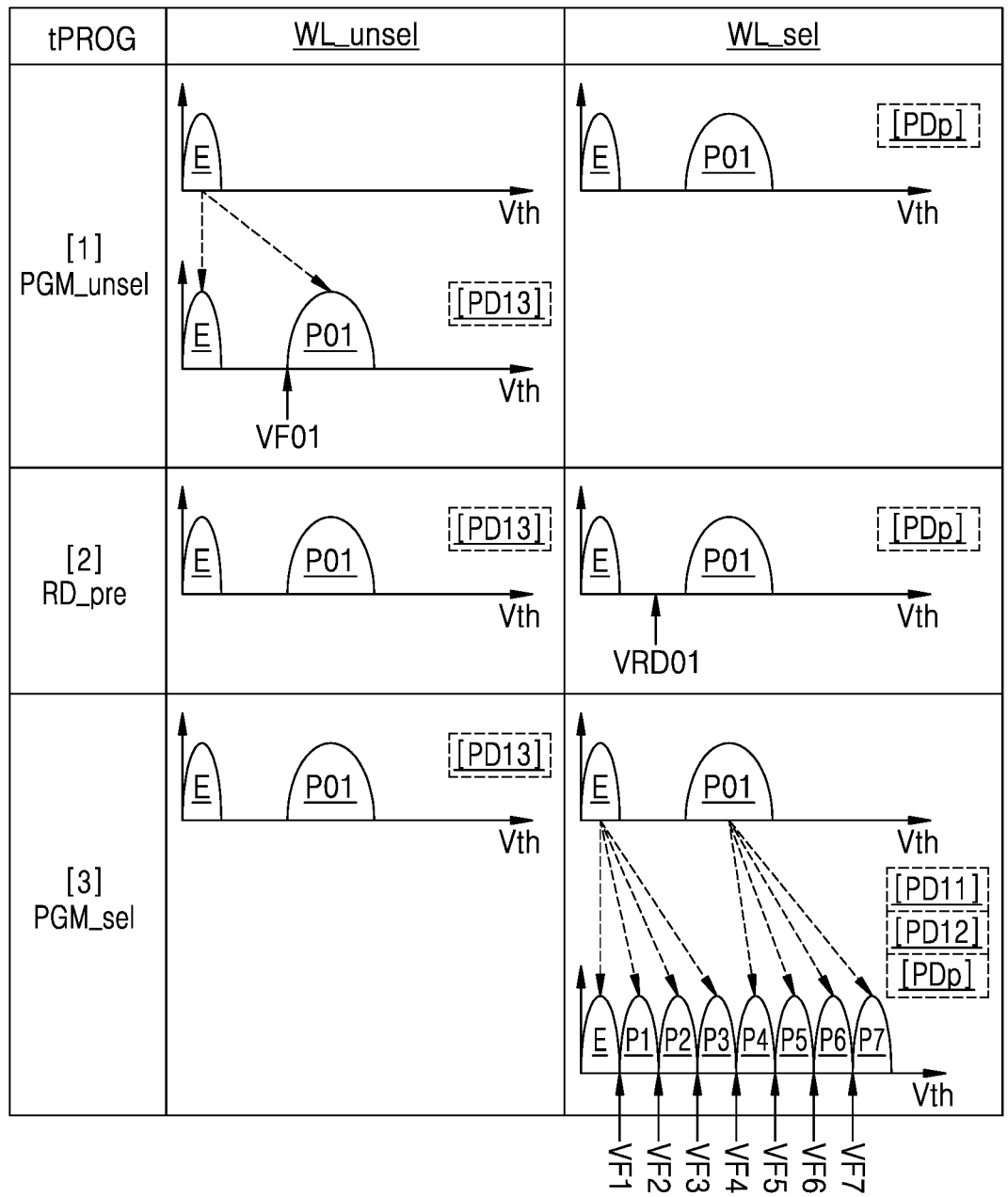

FIGS. 7A and 7B are views illustrating a program method in accordance with a program sequence among various program methods according to embodiments of the inventive concept; FIGS. 7C and 7D are views illustrating a high speed program (HSP) method among various program methods according to embodiments of the inventive concept.

Referring to FIG. 7A, a memory block BLK_1 may include a plurality of memory cells MC connected to first to third string selection lines SSL1 to SSL3 and first to third word lines WL1 to WL3. According to an embodiment of the inventive concept, the memory device may perform a program sequence in accordance with address scrambles 1->2->3 . . . ->9 when first and second step program operations are performed on the plurality of memory cells MC connected to first to third word lines WL1 to WL3. The memory device may sequentially perform a program operation on the memory cells connected to the same word line in a predetermined order. According to an embodiment of the inventive concept, the memory device may perform the program operation on the memory cells connected to the same word line in the order of the memory cell connected to the first string selection line SSL1, the memory cell connected to the second string selection line SSL2, and the memory cell connected to the third string selection line SSL3.

Referring to FIG. 7B, a memory block BLK_1 may include a plurality of memory cells MC connected to first to third string selection lines SSL1 to SSL3 and first to third word lines WL1 to WL3. According to an embodiment of the inventive concept, the memory device may perform a program sequence in accordance with address scrambles 1->2->3 . . . ->6 when first and second step program operations are performed on the plurality of memory cells MC connected to first to third word lines WL1 to WL3 based on a shadow program method.

Hereinafter, in FIGS. 7C and 7D, for convenience sake, in a current program operation, it is assumed that a selected word line is a first word line and an unselected word line is a second word line. Reference numerals are used for distinguishing the word lines from each other and do not mean physical positions of the word lines.

For convenience sake, it is assumed that a previous page PDp is stored in the first word line. For example, before a program operation is performed on the first word line, a program operation may be performed on a $0^{th}$ word line. In the program operation performed on the $0^{th}$ word line, the $0^{th}$ word line may be a selected word line, the first word line may be an unselected word line, and at least one (for example, PDp) of a plurality of pages corresponding to the $0^{th}$ word line may be non-selection programmed to the first word line. In other words, at a point in time at which the program operation starts to be performed on the first word line, the previous page PDp programmed in the previous non-selection program operation may be stored in the first word line.

Referring to FIGS. 7C and 7D, the memory device may receive first, second, and third pages PD11, PD12, and PD13 corresponding to the first word line. According to an embodiment of the inventive concept, the first, second, and third pages PD11, PD12, and PD13 may be stored in a page buffer of the memory device.

The memory device may program one (for example, the third page PD13) of the first, second, and third pages PD11, PD12, and PD13 corresponding to the first word line to the second word line that is the unselected word line. In other words, the memory device may perform a non-selection program operation PGM_unsel on the second word line.

For example, as illustrated in FIG. 7D, the memory device may perform the non-selection program operation PGM_unsel on the second word line so that each of the memory cells connected to the second word line is in one of an erase state E and a non-selection program state P01. According to an embodiment of the inventive concept, in the non-selection program operation PGM_unsel, in order to verify the non-selection program state P01, a non-selection verification voltage VF01 may be used. When the non-selection program operation PGM_unsel is performed on the second word line, the third page PD13 corresponding to the first word line is stored in the second word line and the previous page PDp is stored in the first word line.

According to an embodiment of the inventive concept, when the number of pages corresponding to a selected word line is n (n is a positive integer) and the non-selection program operation PGM_unsel is performed on the unselected word line, memory cells connected to the unselected word line may form threshold voltage distributions in a number less than $2^n$.

Then, the memory device may read the previous page PDp by performing a previous page read operation RD_pre on the first word line. For example, as illustrated in FIG. 7D, each of the memory cells of the first word line in which the previous page PDp is stored may be in one of the erase state E and the non-selection program state P01. The memory device may read the previous page PDp by performing the previous page read operation RD_pre by using a read voltage VRD01.

According to an embodiment of the inventive concept, the previous page PDp read by the previous page read operation RD_pre may be stored in a specific latch of the page buffer. The specific latch may indicate a data latch in which the programmed page (e.g., the third page PD13) is stored in the unselected word line. In other words, after the previous page read operation RD_pre is performed, the page buffer of the memory device may store the first and second pages PD11 and PD12 corresponding to the first word line and the previous page PDp corresponding to the other word line.

Then, the memory device may perform a selection program operation PGM_sel on the first word line based on the first and second pages PD11 and PD12 and the previous page PDp. For example, as described above, after the previous page read operation RD_pre is performed, the page buffer of the memory device may store the first and second pages PD11 and PD12 and the previous page PDp. The memory device may perform the selection program operation PGM_sel on the first word line based on the first and second pages PD11 and PD12 and the previous page PDp stored in the page buffer.

By performing the selection program operation PGM_sel, memory cells in the erase state E among the memory cells of the first word line may be in one of the erase state E and first to third program states P1 to P3 and memory cells in the non-selection program state P01 may be in one of fourth to seventh program states P4 to P7. In the selection program operation PGM_sel, in order to verify the first to seventh program states P1 to P7, first to seventh verification voltages VF1 to VF7 may be used. Such a program operation may be referred to as a 2-8 HSP method, and the inventive concept may be applied during the above program operation, which is an example embodiment. The inventive concept is not limited thereto and may also be applied a 4-8 HSP method.

When the selection program operation PGM_sel is performed on the first word line, the first word line may store the previous page PDp and the first and second pages PD11 and PD12 corresponding to the first word line and the second word line may store the third page PD13 corresponding to the first word line.

Because the embodiment of FIGS. 7A to 7D is an example, the inventive concept is not limited thereto and may also be applied to a sun-who program method.

Figure 8:
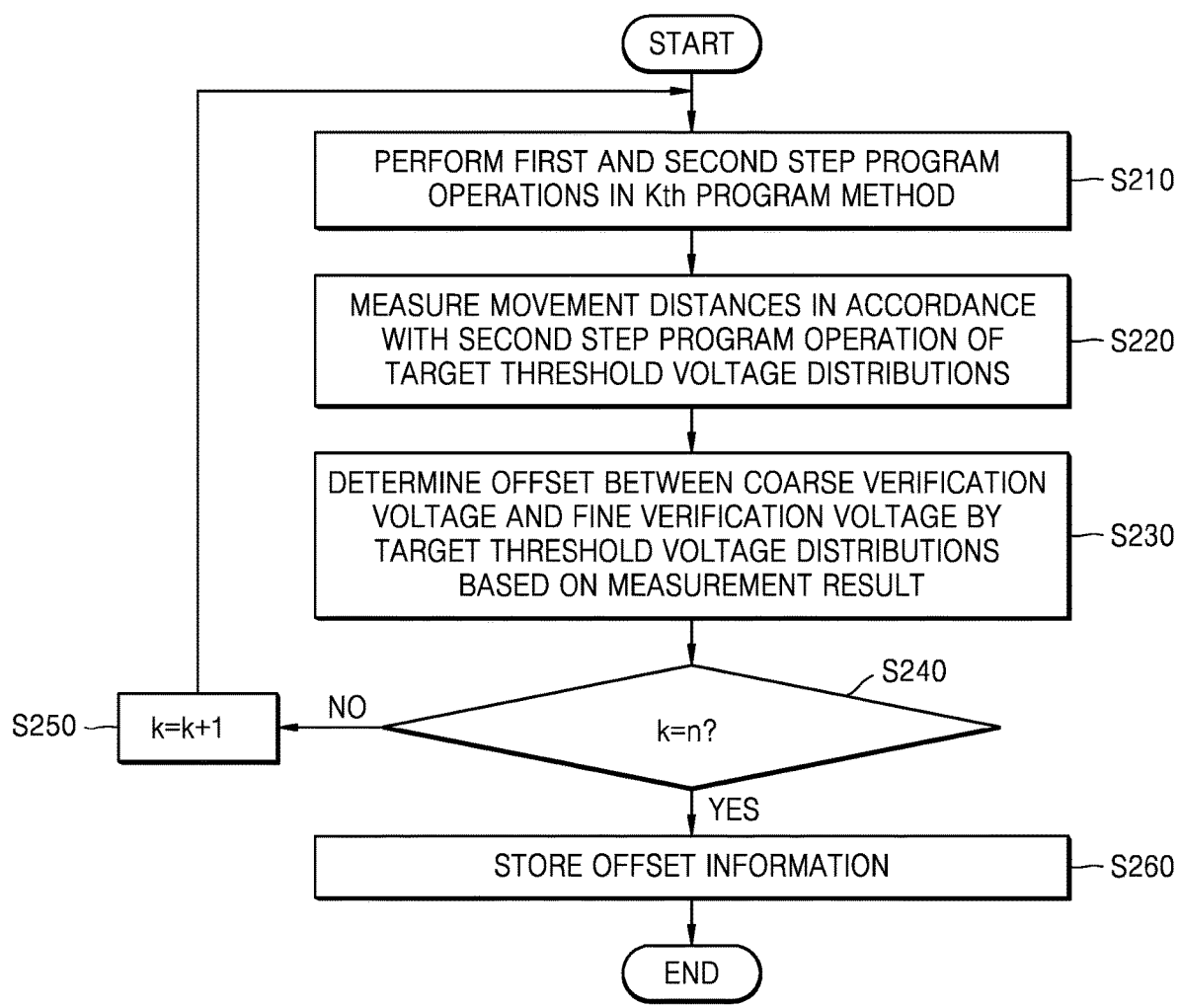
FIG. 8 is a flowchart illustrating a method of generating and storing offset information, according to an embodiment of the inventive concept.

FIG. 8 is a flowchart illustrating a method of generating and storing offset information according to an embodiment of the inventive concept. For example, the memory device may be connected to an external test device and may generate offset information under control of the external test device. In another example, the memory device may generate offset information through an internal built-in self-test (BIST) circuit. Hereinafter, an embodiment in which the offset information is generated by the memory device will be mainly described. However, the inventive concept is not limited thereto, and the offset information according to the inventive concept may be generated in various methods to include a plurality of offsets considering characteristics by threshold voltage distributions for the memory cells of the memory device.

Referring to FIG. 8, in operation S210, the memory device may perform first and second step program operations in a kth (k is an integer of no less than 1) program method. In operation S220, the memory device may measure movement distances in accordance with the second step program operation of a plurality of target threshold voltage distributions respectively corresponding to a plurality of program states. For example, the memory device may determine distribution speeds of the plurality of target threshold voltage distributions by measuring the movement distances from a plurality of approximate threshold voltage distributions formed in the first step program operation to the plurality of target threshold voltage distributions in the second step program operation. In operation S230, the memory device may determine an offset between a coarse verification voltage and a fine verification voltage by target threshold voltage distributions based on the measurement result of operation S220. For example, the memory device may determine a first offset between a coarse verification voltage and a fine verification voltage used for forming a first target threshold voltage distribution corresponding to a first program state and a second offset between a coarse verification voltage and a fine verification voltage used for forming a second target threshold voltage distribution corresponding to a second program state. The first offset may be different from the second offset. In operation S240, the memory device may determine whether 'k' is equal to 'n' when the number of supportable program methods is n (n is an integer of no less than 1) and may check whether offsets corresponding to all the supportable program methods are generated. When it is determined in operation S240 that 'k' is not equal to 'n', operation S250 is subsequently performed so that the memory device may count up to 'k' and operation S210 may be subsequently performed. When it is determined in operation S240 that 'k' is equal to the memory device may store offset information including offsets respectively corresponding to a plurality of program methods in a predetermined region in the memory device.

FIGS. 9A and 9B are table diagrams illustrating offset information according to an embodiment of the inventive concept.

Referring to FIG. 9A, a first table Table_1 as an implementation example of the offset information may include first to nth offset data items OS_DATA1 to OS_DATAn respectively corresponding to first to nth program methods M1 to Mn. In some embodiments of the inventive concept, the memory device may support a limited number of program methods. In this case, the offset information of the memory device may include only offset data corresponding to a supportable program method. For example, the first program method M1 may correspond to a quadruple level cell QLC in a cell type and an '8-16' shadow program method. On the other hand, each of the first to nth offset data items OS_DATA1 to OS_DATAn may include offsets applied to a plurality of threshold voltage distributions, as described in detail in FIG. 9B.

Referring to FIG. 9B, a second table Table_2 as an implementation example of the first offset data OS_DATA1 of the first table Table_1 of FIG. 9A may include first to fifteenth offsets OS1 to OS15 for forming first to fifteenth target threshold voltage distributions P1 to P15 respectively corresponding to first to fifteenth program states. For example, the memory device may perform a second step program operation by using a coarse verification voltage and a fine verification voltage having the first offset OS1 to form the first target threshold voltage distribution P1. In addition, the memory device may perform the second step program operation by using a coarse verification voltage and a fine verification voltage having the second offset OS2 to form the second target threshold voltage distribution P2. Further, the memory device may perform the second step program operation by using a coarse verification voltage and a fine verification voltage having the fifteenth offset OS15 to form the fifteenth target threshold voltage distribution P15.

FIGS. 10A to 10F are views illustrating a second step program operation using an offset according to an embodiment of the inventive concept. In FIGS. 10A to 10F, description is given based on an embodiment in which the offset is implemented by a length difference between a develop interval using a coarse verification voltage and a develop interval using a fine verification voltage. Hereinafter, a description is given based on the second step program operation for forming first and second target threshold voltage distributions and it is premised that the second target threshold voltage distribution corresponds to higher program state than the first target threshold voltage distribution, the second target threshold voltage distribution has a distribution speed greater than that of the first target threshold voltage distribution, and a second offset corresponding to the second target threshold voltage distribution is greater than a first offset corresponding to the first target threshold voltage distribution.

Figure 10A:
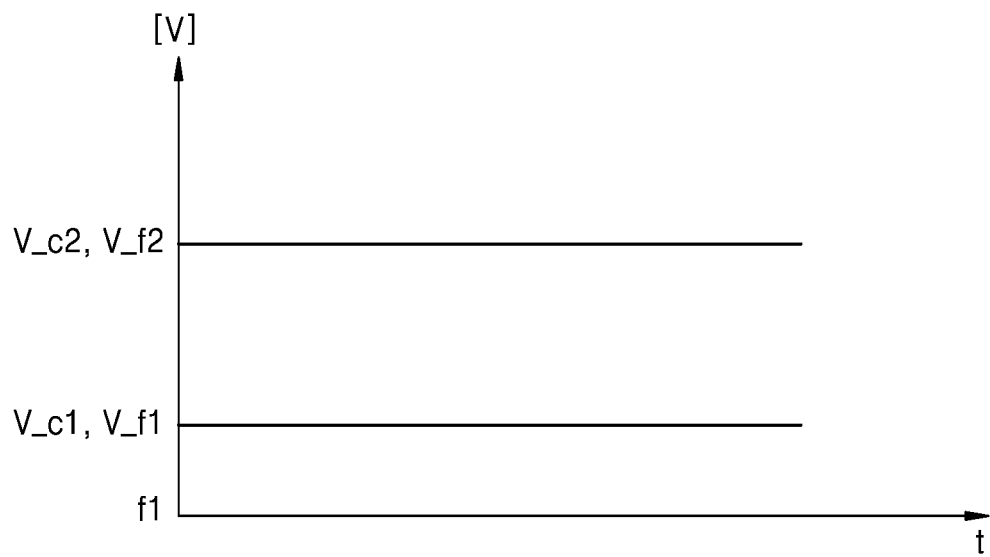
FIGS. 10A, 10B, 10C, 10D, 10E and 10F are views illustrating a second step program operation using an offset according to an embodiment of the inventive concept.

Referring to FIG. 10A, levels of the coarse verification voltage V_c1 and the fine verification voltage V_f1 for forming the first target threshold voltage distribution may be the same as each other as a first level or similar to each other. Levels of the coarse verification voltage V_c2 and the fine verification voltage V_f2 for forming the second target threshold voltage distribution may be the same as each other as a second level or similar to each other. The second level may be higher than the first level. FIG. 10A is merely an example embodiment. The inventive concept is not limited thereto, and the coarse verification voltages V_c1 and V_c2 and the fine verification voltages V_f1 and V_f2 may be implemented to have various levels conforming to the second step program operation.

Figure 10B:
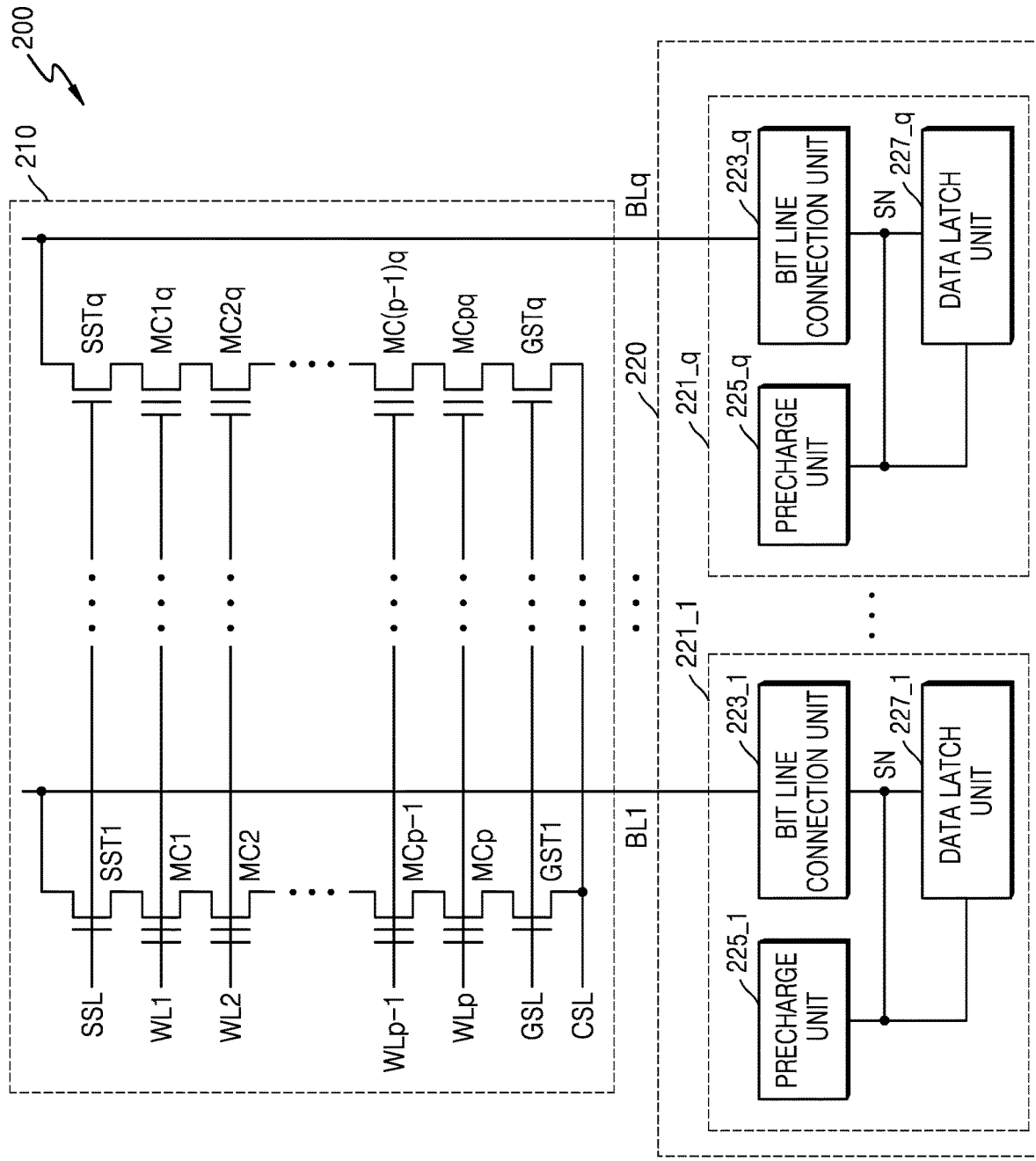

Referring to FIG. 10B, a memory device 200 may include a memory cell array 210 and a page buffer circuit 220. The memory cell array 210 and the page buffer circuit 220 illustrated in FIG. 2 may be an example of the memory cell array 110 and the page buffer circuit 120 illustrated in FIG. 1.

The memory cell array 210 may include a plurality of string selection transistors SST1 to SSTq, a plurality of memory cells MC1$q$ to MCp$q$, and a plurality of ground selection transistors GST1 to GSTq. The plurality of memory cells MC1$q$ to MCp$q$ may be connected between the plurality of string selection transistors SST1 to SSTq and the plurality of ground selection transistors GST1 to GSTq, and control gates of the plurality of memory cells MC1$q$ to MCp$q$ may be respectively connected to a plurality of word lines WL1 to WLp.

Drains of the plurality of string selection transistors SST1 to SSTq may be respectively connected to a plurality of bit lines BL1 to BLq, and gates of the plurality of string selection transistors SST1 to SSTq may be connected to a plurality of string selection lines SSL. In addition, sources of the plurality of ground selection transistors GST1 to GSTq may be connected to a common source line CSL and gates of the plurality of ground selection transistors GST1 to GSTq may be connected to a ground selection line GSL. One string selection transistor SST1, one ground selection transistor GST1, and the plurality of memory cells MC1$q$ to MCpq connected between the string selection transistor SST1 and the ground selection transistor GST1 may be referred to as one string.

The page buffer circuit 220 may include a plurality of page buffers 221_1 to 221_q respectively corresponding to the plurality of bit lines BL1 to BLq. The plurality of page buffers 221_1 to 221_q may include a plurality of bit line connection units 223_1 to 223_q, a plurality of precharge units 225_1 to 225_q, and a plurality of data latch units 227_1 to 227_q. The plurality of precharge units 225_1 to 225_q may be connected to a sensing node SN and may precharge the sensing node SN in response to a precharge control signal in a precharge interval by a predetermined voltage. The plurality of data latch units 227_1 to 227_q may read data of a selected memory cell by sensing a voltage level of the sensing node SN or may output data received from the outside to the plurality of bit line connection units 223_1 to 223_q through the sensing node SN.

Figure 10C:
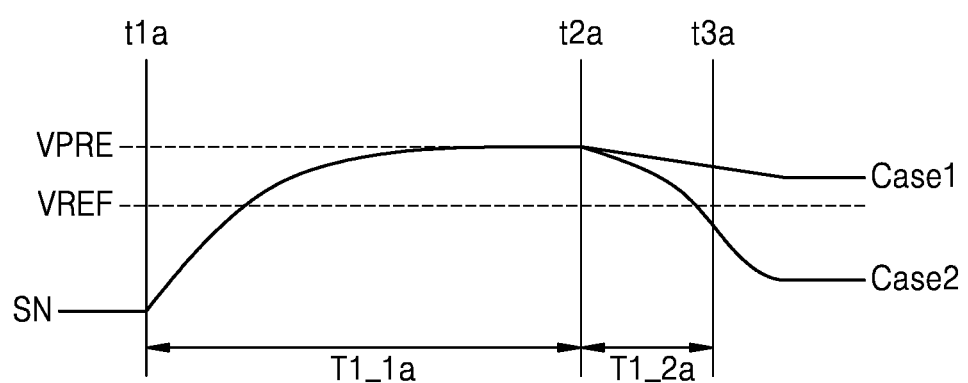

Referring to FIG. 10C, the memory device 200 may precharge the sensing node SN by a predetermined voltage VPRE in a precharge interval T1_1$a$ between a first time t1$a$ and a second time t2$a$ when a coarse verification operation for forming the first target threshold voltage distribution is performed. Then, in a first develop interval T1_2$a$ between the second time t2$a$ and a third time t3$a$, the coarse verification voltage V_c1 is applied to the plurality of word lines WL1 to WLp so that a voltage of the sensing node SN may be maintained when a threshold voltage of the selected memory cell is greater than the coarse verification voltage V_c1 and may be reduced when the threshold voltage of the selected memory cell is less than the coarse verification voltage V_c1. After the first develop interval T1_2$a$, the selected memory cell passes the coarse verification operation when the voltage of the sensing node SN is no less than a reference voltage VREF and fails the coarse verification operation when the voltage of the sensing node SN is less than the reference voltage VREF. In other words, when the voltage of the sensing node SN is greater than the reference voltage VREF, the selected memory cell pass the coarse verification operation, and when the voltage of the sensing node SN is less than the reference voltage VREF, the selected memory cell fails the coarse verification such that a program loop may be repeatedly performed on the selected memory cell. For example, the selected memory cell may pass the coarse verification operation in a first case and may fail the coarse verification operation in a second case causing the program loop to repeat.

Figure 10D:
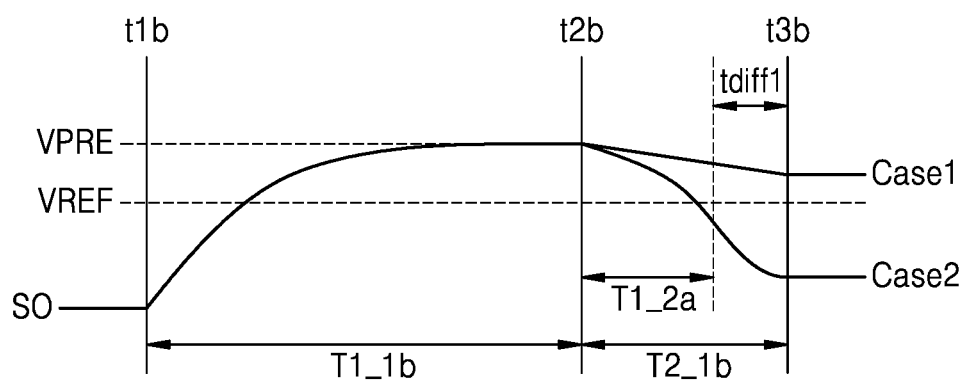

Referring to FIG. 10D, the memory device 200 may precharge the sensing node SN by the predetermined voltage VPRE in a precharge interval between a fourth time t1b and a fifth time t2b when a fine verification operation for forming the first target threshold voltage distribution is performed. Then, in a second develop interval T2_1b between the fifth time t2b and a sixth time t3b, the fine verification voltage V_f1 is applied to the plurality of word lines WL1 to WLp so that the voltage of the sensing node SN may be maintained when the threshold voltage of the selected memory cell is greater than the fine verification voltage V_f1 and may be reduced when the threshold voltage of the selected memory cell is less than the fine verification voltage V_f1. After the second develop interval T1_2b, the selected memory cell passes the fine verification operation when the voltage of the sensing node SN is no less than the reference voltage VREF and fails the fine verification operation when the voltage of the sensing node SN is less than the reference voltage VREF so that a program loop may be repeatedly performed on the selected memory cell. For example, the selected memory cell may pass the fine verification operation in a first case and may fail the fine verification operation in a second case. According to an embodiment of the inventive concept, a first length difference tdiff1 may exist between the first develop interval T1_2a and the second develop interval T1_2b for forming the first target threshold voltage distribution.

Figure 10E:
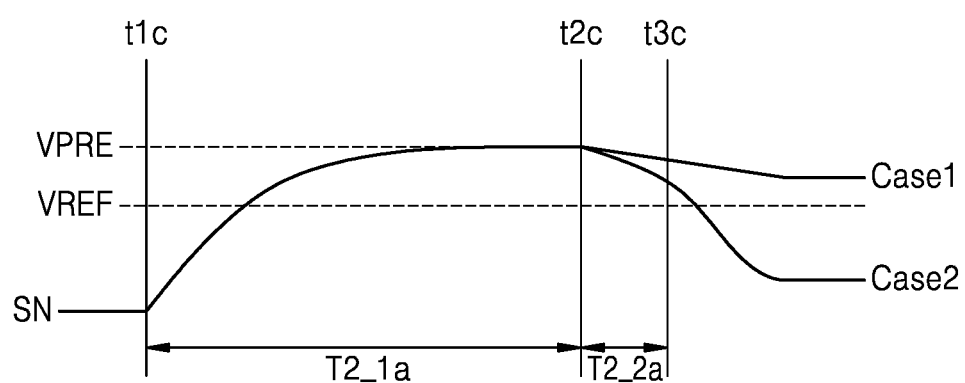

Referring to FIG. 10E, the memory device 200 may precharge the sensing node SN by the predetermined voltage VPRE in a precharge interval T2_1a between a seventh time t1c and an eighth time t2c when a coarse verification operation for forming the second target threshold voltage distribution is performed. Then, in a first develop interval T2_2a between the eighth time t2c and a ninth time t3c, the coarse verification voltage V_c2 is applied to the plurality of word lines WL1 to WLp so that the voltage of the sensing node SN may be maintained when the threshold voltage of the selected memory cell is greater than the coarse verification voltage V_c2 and may be reduced when the threshold voltage of the selected memory cell is less than the coarse verification voltage V_c2. After the first develop interval T2_2a, the selected memory cell passes the coarse verification operation when the voltage of the sensing node SN is no less than the reference voltage VREF and fails the coarse verification operation when the voltage of the sensing node SN is less than the reference voltage VREF so that a program loop may be repeatedly performed on the selected memory cell. For example, the selected memory cell may pass the coarse verification operation in a first case and may fail the coarse verification operation in a second case unlike in FIG. 10C.

Figure 10F:
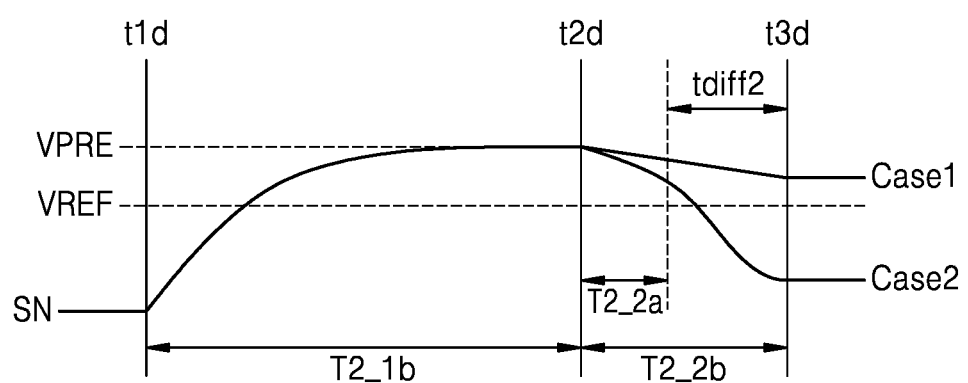

Referring to FIG. 10F, the memory device 200 may precharge the sensing node SN by the predetermined voltage VPRE in a precharge interval T2_1b between a tenth time t1d and an eleventh time t2d when a fine verification operation for forming the second target threshold voltage distribution is performed. Then, in a second develop interval T2_2b between the eleventh time t2d and a twelfth time t3b, the fine verification voltage V_f2 is applied to the plurality of word lines WL1 to WLp so that the voltage of the sensing node SN may be maintained when the threshold voltage of the selected memory cell is greater than the fine verification voltage V_f2 and may be reduced when the threshold voltage of the selected memory cell is less than the fine verification voltage V_f2. After the second develop interval T2_2b, the selected memory cell passes the fine verification operation when the voltage of the sensing node SN is no less than the reference voltage VREF and fails the fine verification operation when the voltage of the sensing node SN is less than the reference voltage VREF so that a program loop may be repeatedly performed on the selected memory cell. For example, the selected memory cell may pass the fine verification operation in a first case and may fail the fine verification operation in a second case. According to an embodiment of the inventive concept, a second length difference tdiff2 may exist between the first develop interval T2_2a and the second develop interval T2_2b for forming the second target threshold voltage distribution.

According to an embodiment of the inventive concept, the second length difference tdiff2 may be greater than the first length difference tdiff1. In other words, the memory device may make the first develop interval T2_2a using the coarse verification voltage V_c2 shorter than the first develop interval T1_2a using the coarse verification voltage V_c1 considering that the second target threshold voltage distribution is faster than the first target threshold voltage distribution. Therefore, the memory device may increase the number of memory cells passing the coarse verification operation when the second target threshold voltage distribution is formed considering characteristics of the second target threshold voltage distribution.

The memory device according to an embodiment of the inventive concept may control the number of memory cells passing a coarse verification operation considering characteristics of a target threshold voltage distribution and, as a result, may improve data reliability and performance of the memory device by forming optimal target threshold voltage distributions.

Figure 11A:
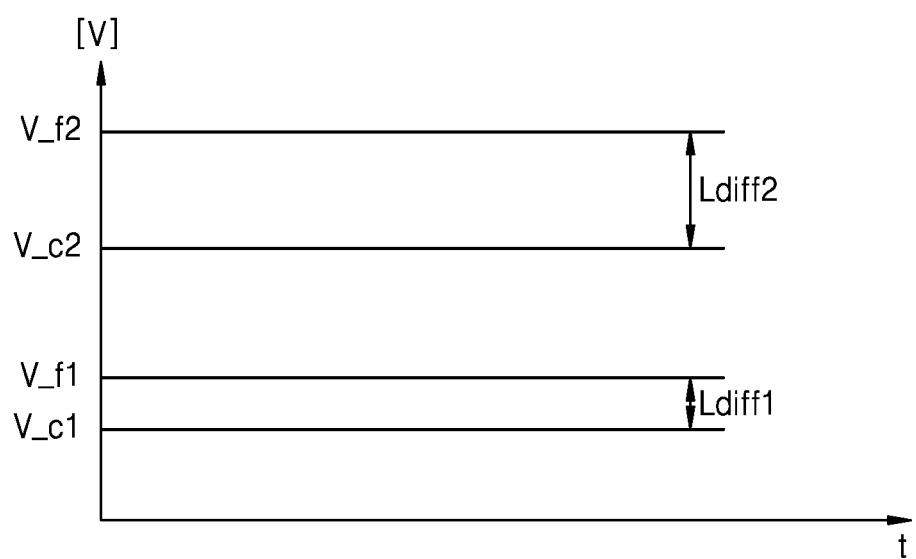
FIGS. 11A, 11B and 11C are views illustrating a second step program operation using an offset according to an embodiment of the inventive concept.
Figure 11B:
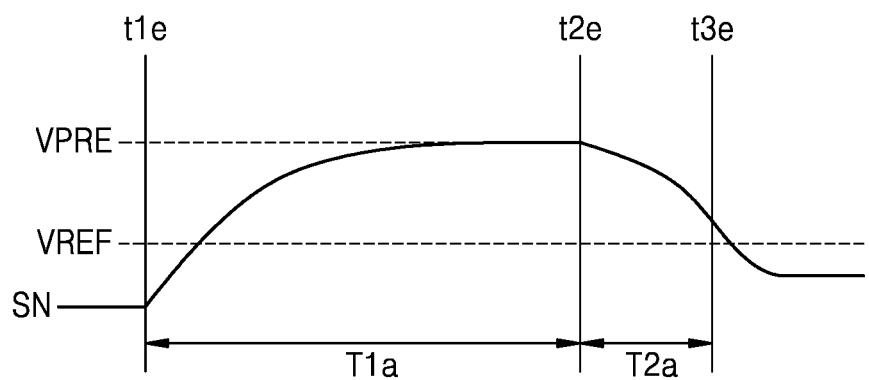
Figure 11C:
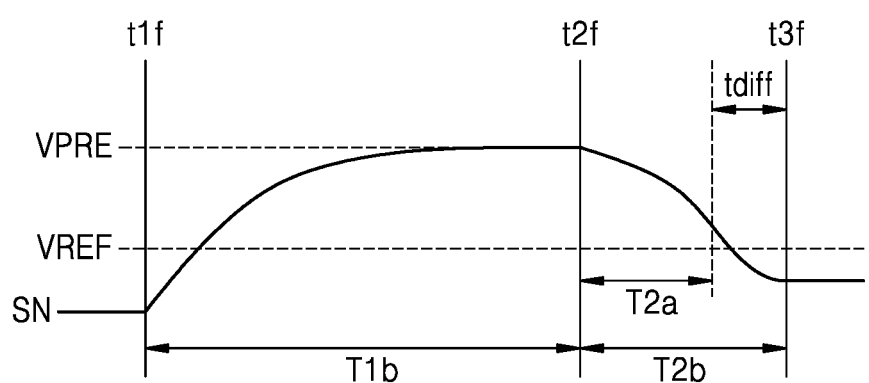

FIGS. 11A to 11C are views illustrating a second step program operation using an offset according to an embodiment of the inventive concept. In FIGS. 11A to 11C, the description is given based on an embodiment in which the offset is implemented by a level difference between a coarse verification voltage and a fine verification voltage. Hereinafter, the description is given based on the second step program operation for forming first and second target threshold voltage distributions and it is premised that the second target threshold voltage distribution corresponds to a higher program state than the first target threshold voltage distribution, the second target threshold voltage distribution has a distribution speed greater than that of the first target threshold voltage distribution, and a second offset corresponding to the second target threshold voltage distribution is greater than a first offset corresponding to the first target threshold voltage distribution.

Referring to FIG. 11A, the coarse verification voltage V_c1 for forming the first target threshold voltage distribution is at a first level and the fine verification voltage V_f1 may be at a second level. The second level may be greater than the first level. The level difference between the coarse verification voltage V_c1 and the fine verification voltage V_f1 may correspond to a first level difference Ldiff1. The coarse verification voltage V_c2 for forming the second target threshold voltage distribution may be at a third level and the fine verification voltage V_f2 may be at a fourth level. The fourth level may be greater than the third level. The level difference between the coarse verification voltage V_c2 and the fine verification voltage V_f2 may correspond to a second level difference Ldiff2. The second level difference Ldiff2 may be greater than the first level difference Ldiff1. FIG. 11A is an example embodiment. The inventive concept is not limited thereto, and the coarse verification voltages V_c1 and V_c2 and the fine verification voltages V_f1 and V_f2 may be implemented to have various levels conforming to the second step program operation.

Referring to FIGS. 10B and 11B, the memory device 200 may precharge the sensing node SN by the predetermined voltage VPRE in a precharge interval T1a between a first time t1c and a second time t2e when a coarse verification operation for forming the first target threshold voltage distribution is performed. Then, in a first develop interval T2a between the second time t2e and a third time t3e, the coarse verification voltage V_c1 may be applied to the plurality of word lines WL1 to WLp.

Referring to FIGS. 10B and 11C, the memory device 200 may precharge the sensing node SN by the predetermined voltage VPRE in a precharge interval T1b between a fourth time t1f and a fifth time t2f when a fine verification operation for forming the first target threshold voltage distribution is performed. Then, in a second develop interval T2b between the fifth time t2f and a sixth time t3f, the fine verification voltage V_f1 may be applied to the plurality of word lines WL1 to WLp. According to an embodiment of the inventive concept, a predetermined length difference tdiff may exist between the first develop interval T2a and the second develop interval T2b for forming the first target threshold voltage distribution and a length difference between the first develop interval and the second develop interval for forming the second target threshold voltage distribution may correspond to the predetermined length difference tdiff. In other words, the predetermined length difference tdiff between the first develop interval T2a and the second develop interval T2b for forming the first target threshold voltage distribution and the length difference between the first develop interval and the second develop interval for forming the second target threshold voltage distribution may be the same.

On the other hand, in some embodiments of the inventive concept, the memory device may control the level difference between the coarse verification voltage and the fine verification voltage and the length difference between the first develop interval using the coarse verification voltage and the second develop interval using the fine verification voltage to vary by target threshold voltage distributions. In other words, the embodiment described with reference to FIGS. 10A to 10F may be combined with the embodiment illustrated described with reference to FIGS. 11A to 11C so that the combination may be implemented by the memory device.

Figure 12A:
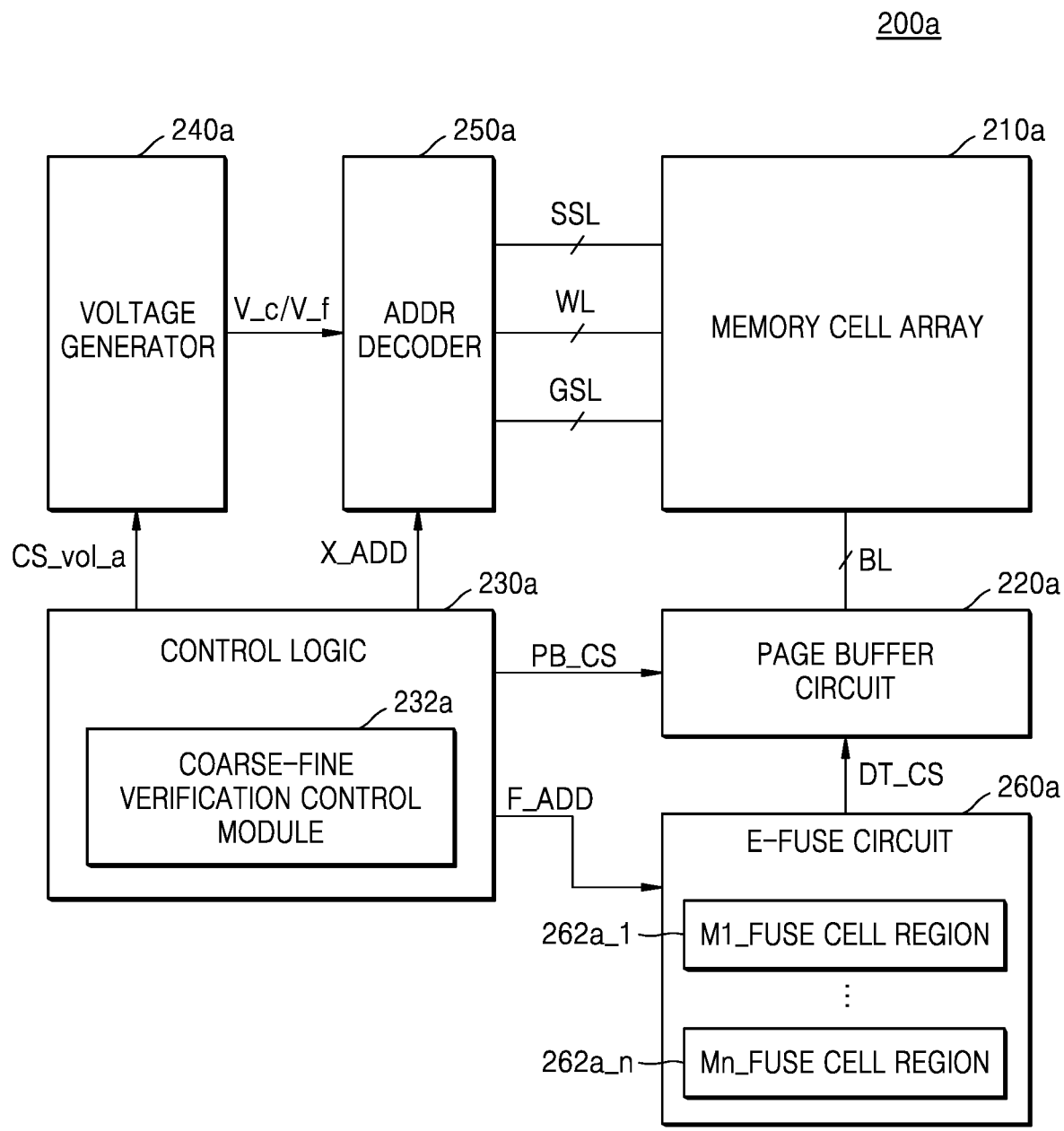
FIG. 12A is a block diagram illustrating an implementation example of a memory device performing a second step program operation according to an embodiment of the inventive concept.
Figure 12B:
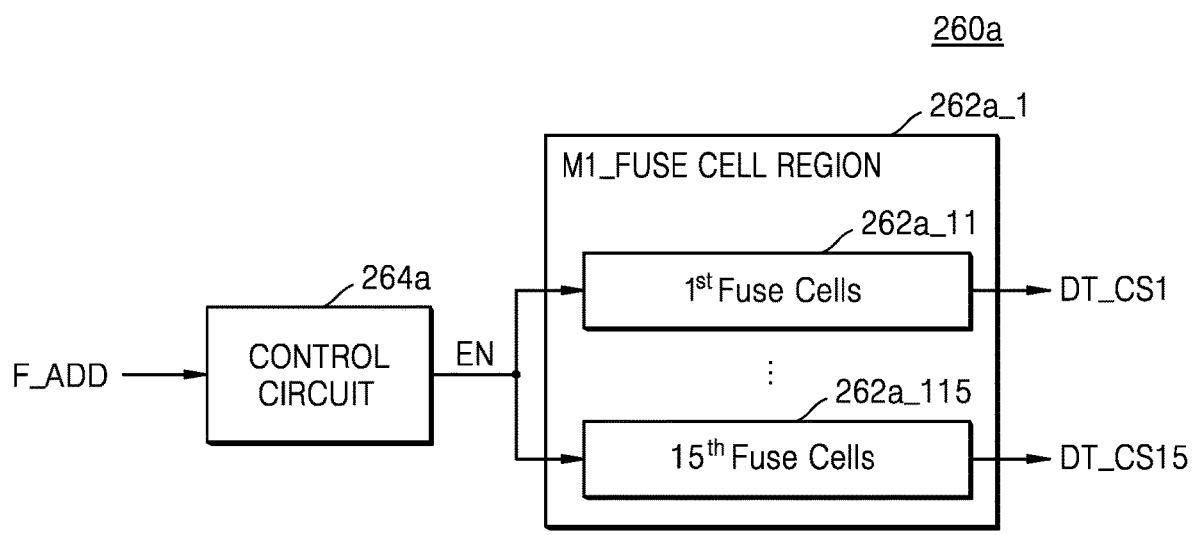
FIG. 12B is a block diagram illustrating the electronic fuse circuit of FIG. 12A.

FIG. 12A is a block diagram illustrating an implementation example of a memory device 200a performing a second step program operation according to an embodiment of the inventive concept and FIG. 12B is a block diagram illustrating the electronic fuse circuit 260a of FIG. 12A. Hereinafter, for convenience sake, the description previously given for overlapping elements with reference to FIG. 1 may be omitted. The memory device 200a of FIG. 12A may perform the operation described with reference to FIGS. 10A to 10F.

Referring to FIG. 12A, the memory device 200a may further include the electronic fuse circuit 260a in comparison with the memory device 100 of FIG. 1. The electronic fuse circuit 260a may include first to nth fuse cell regions 262a_1 to 262a_n. In each of the first to nth fuse cell regions 262a_1 to 262a_n, offset information conforming a corresponding program method may be stored. For example, in the first fuse cell region 262a_1, offset information conforming to a first program method may be stored. In accordance with the number of program methods that may be supported by the memory device 200a, the number of fuse cell regions included in the electronic fuse circuit 260a may vary.

According to an embodiment of the inventive concept, a coarse-fine verification control module 232a may generate a fuse address F_ADD based on a program method applied to the second step program operation and may provide the fuse address F_ADD to the electronic fuse circuit 260a. One of the first to nth fuse cell regions 262a_1 to 262a_n may be activated in response to the fuse address F_ADD and a develop control signal. DT_CS for controlling a develop interval of the second step program operation may be generated. The electronic fuse circuit 260a may provide the develop control signal DT_CS to the page buffer circuit 220a and may control connection of a sensing node so that a length difference between a coarse verification interval and a fine verification interval varies in accordance with characteristics by target threshold voltage distributions. In addition, a control logic 230a may provide a voltage control signal CS_vol_a to a voltage generator 240a so that the voltage generator 240a generates a coarse verification voltage V_c and a fine verification voltage V_f conforming a coarse verification operation and a fine verification operation using the electronic fuse circuit 260a. Hereinafter, in FIG. 12B, a detailed description of the first fuse cell region 262a_1 included in the electronic fuse circuit 260a is described assuming that the program method corresponding to the first fuse cell region 262a_1 is a quadruple level cell.

Referring to FIG. 12B, the electronic fuse circuit 260a may include a control circuit 264a and the first fuse cell region 262a_1. The first fuse cell region 262a_1 may include first to fifteenth fuse cells 262a_1 to 262a_115. In the first to fifteenth fuse cells 262a_11 to 262a_115, offsets for forming first to fifteenth target threshold voltage distributions may be respectively stored. For example, a first offset for forming the first target threshold voltage distribution may be stored in the first fuse cells 262a_1 and a second offset for forming the second target threshold voltage distribution may be stored in the second fuse cells 262a_11. The control circuit 264a may generate an enable signal EN for selectively activating one of the first to fifteenth fuse cells 262a_11 to 262a_115 in response to the fuse address F_ADD. When the first to fifteenth fuse cells 262a_11 to 262a_115 are activated, the first to fifteenth fuse cells 262a_11 to 262a_115 may respectively output first to fifteenth develop control signals DT_CS1 to DT_CS15.

Control of the develop interval using the electronic fuse circuit 260a illustrated in FIGS. 12A and 12B is merely an example. The inventive concept is not limited thereto and various embodiments for controlling the develop interval may be applied to the memory device 200a.

Figure 13:
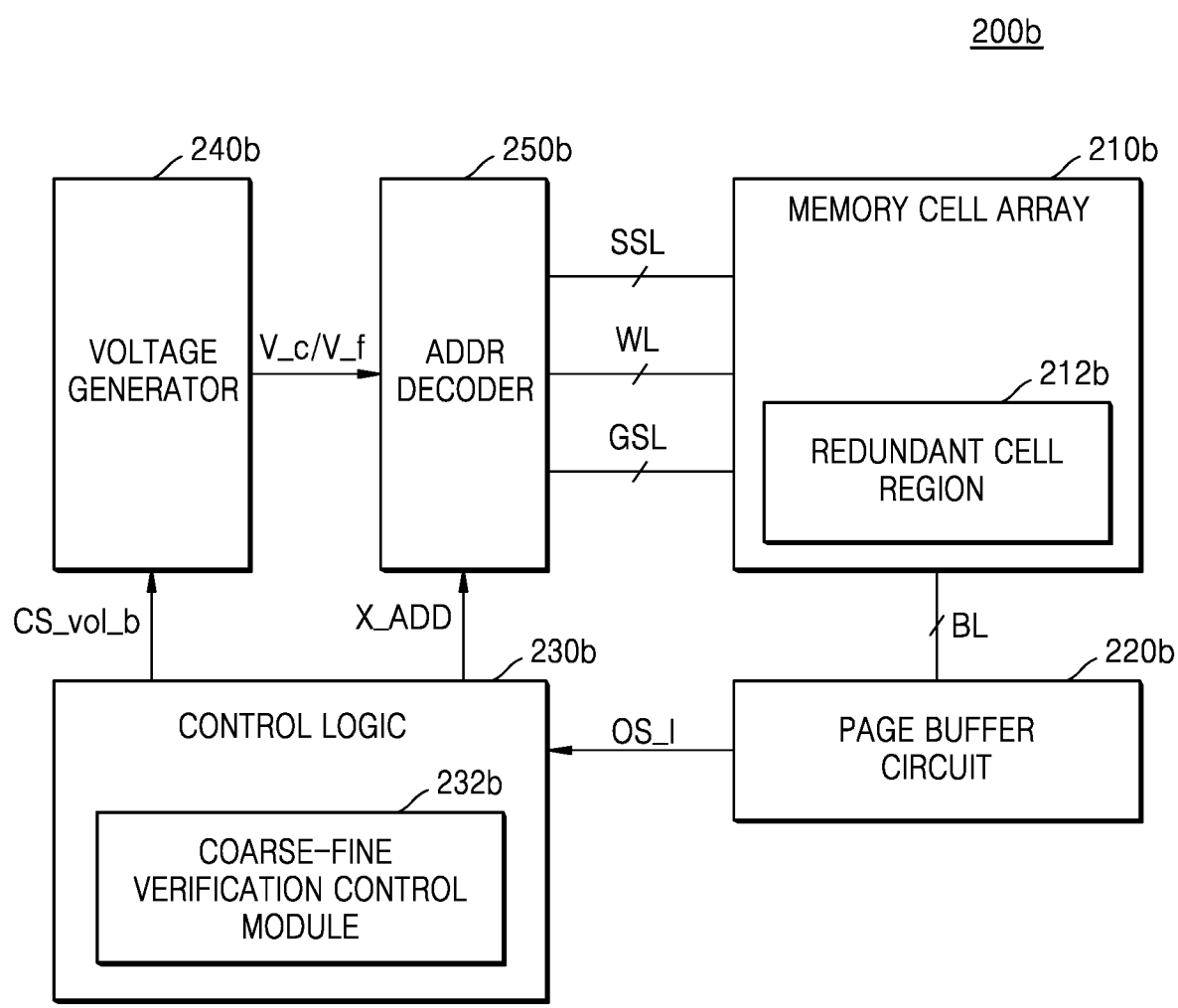
FIG. 13 is a block diagram illustrating another implementation example of a memory device performing a second step program operation according to an embodiment of the inventive concept.

FIG. 13 is a block diagram illustrating another implementation example of a memory device 200b performing a second step program operation according to an embodiment of the inventive concept. Hereinafter, for convenience sake, the description previously given for overlapping elements with reference to FIG. 1 may be omitted. The memory device 200b of FIG. 13 may perform the operation described with reference to FIGS. 11A to 11C.

Referring to FIG. 13, a memory cell array 210b may include a redundant cell region 212b. In the redundant cell region 212b, offset information according to embodiments of the inventive concept may be stored. A control logic 230b may receive offset information OS_I from the redundant cell region 212b through a page buffer circuit 220b. The control logic 230b may generate a voltage control signal CS_vol_b based on the offset information OS_I. A voltage generator 240b may generate the coarse verification voltage V_c and the fine verification voltage V_f having a level difference in accordance with characteristics by target threshold voltage distributions in response to the voltage control signal CS_vol_b.

Figure 14:
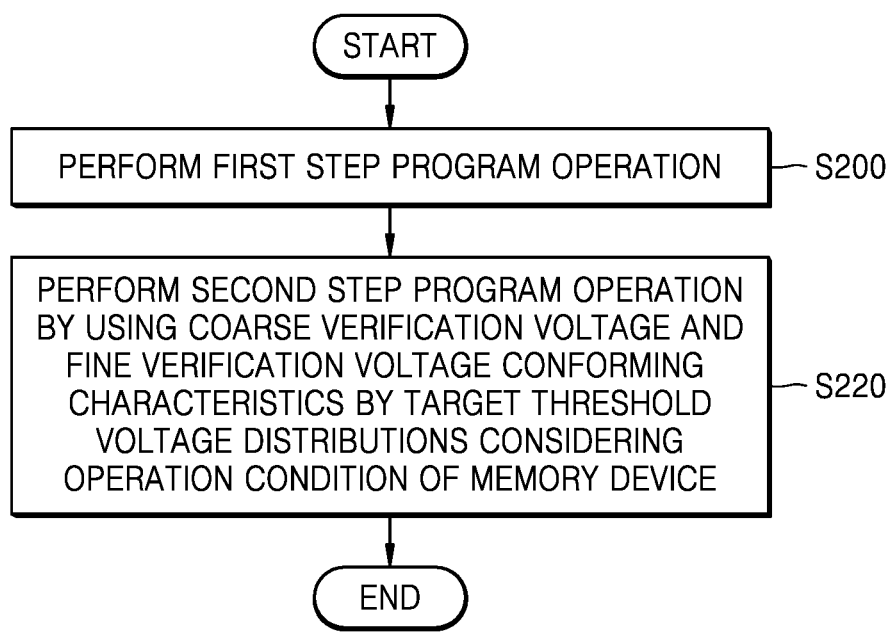
FIG. 14 is a flowchart illustrating a method of operating a memory device, according to an embodiment of the inventive concept.

FIG. 14 is a flowchart illustrating a method of operating a memory device, according to an embodiment of the inventive concept.

Referring to FIG. 14, in operation S200, the memory device may perform a first step program operation. In operation S220, the memory device may perform a second step program operation by using a coarse verification voltage and a fine verification voltage conforming to characteristics by target threshold voltage distributions considering an operation condition thereof. The operation condition of the memory device may include a temperature condition, an interference condition, a noise condition, and a program/erase (P/E) cycle condition under which the memory device currently performs a memory operation. Memory cell characteristics may change in accordance with the operation condition of the memory device so that characteristics of the above-described target threshold voltage distributions may change. According to an embodiment of the inventive concept, the memory device updates offset information to be adaptive to a change in characteristics of current target threshold voltage distributions based on the operation condition thereof and may perform the second step program operation based on the updated offset information.

Figure 15:
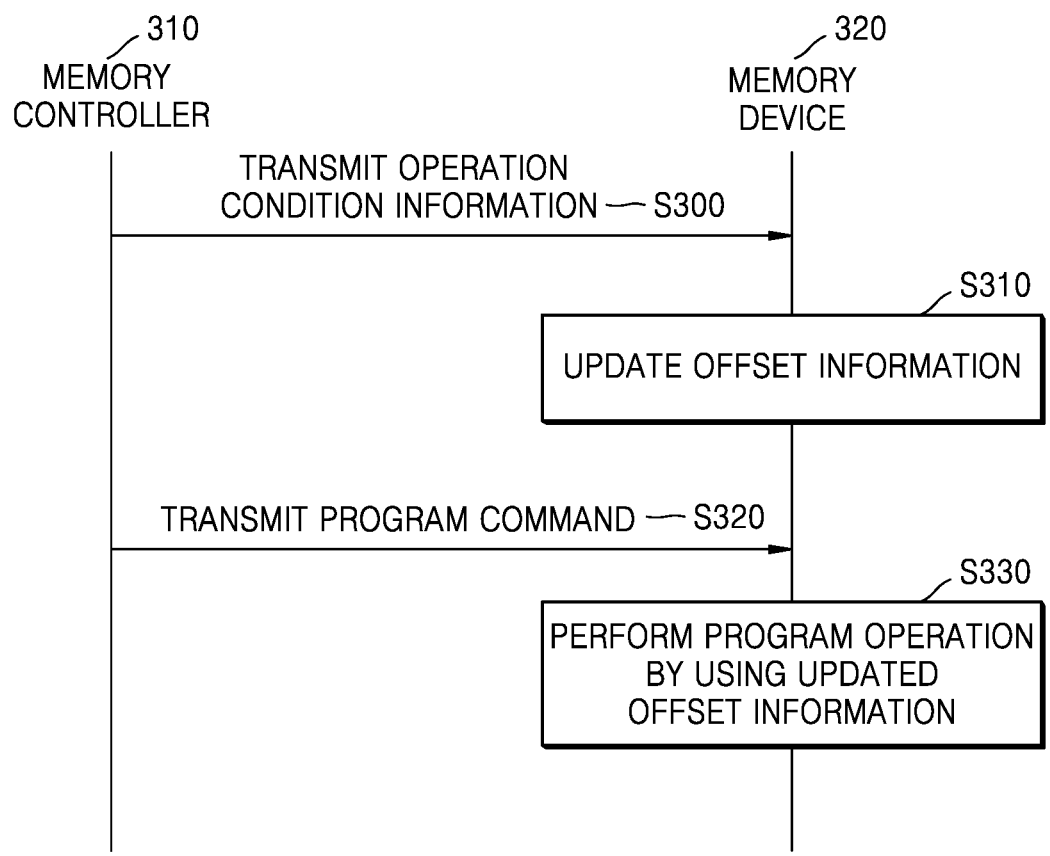
FIG. 15 is a flowchart illustrating a method of operating a memory system, according to an embodiment of the inventive concept.

FIG. 15 is a flowchart illustrating a method of operating a memory system, according to an embodiment of the inventive concept.

Referring to FIG. 15, the memory system may include a memory controller 310 and a memory device 320. The memory controller 310 may periodically or non-periodically monitor an operation condition of the memory device 320, may generate operation condition information based on the monitoring result, and may update the operation condition information. In operation S300, the memory controller 310 may transmit the operation condition information to the memory device 320. In operation S310, the memory device 320 may update offset information based on the operation condition information. In operation S320, the memory controller 310 may transmit a program command to the memory device 320. In operation S330, the memory device 320 may perform a program operation including the first and second step program operations using the updated offset information in response to the program command.

Figure 16:
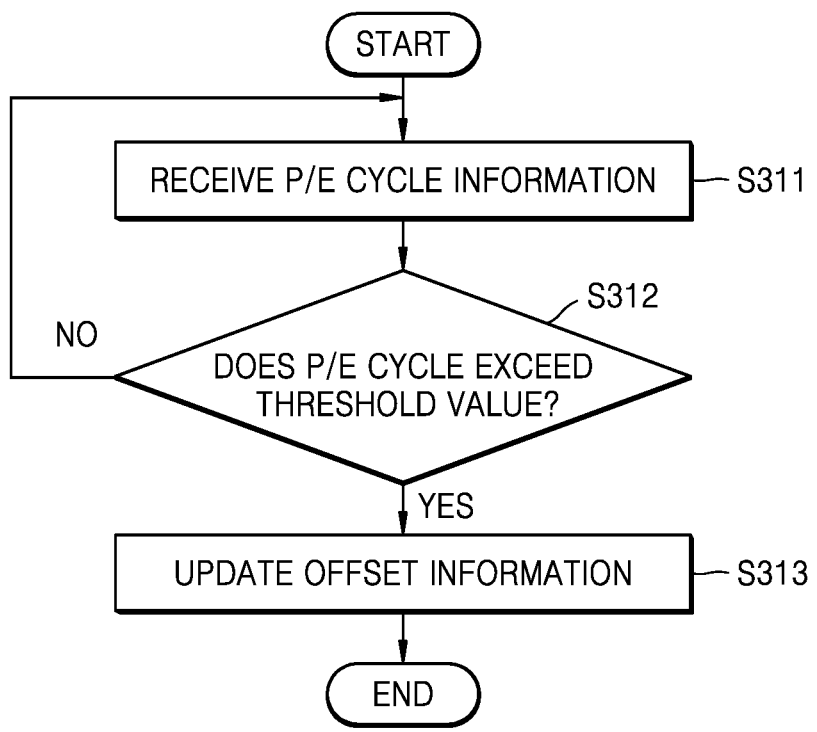
FIG. 16 is a flowchart illustrating an operation of a memory device updating offset information based on program/erase (P/E) cycle information in operation S310.
Figure 17A:
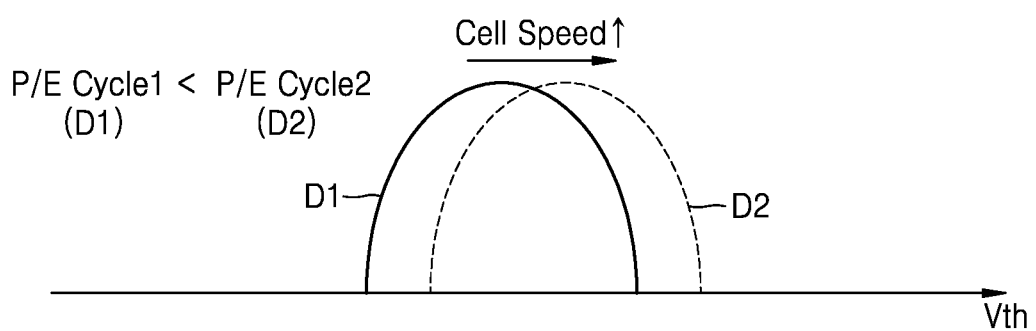
FIGS. 17A and 17B are views illustrating an operation of updating offset information in accordance with a P/E cycle of a memory device.
Figure 17B:
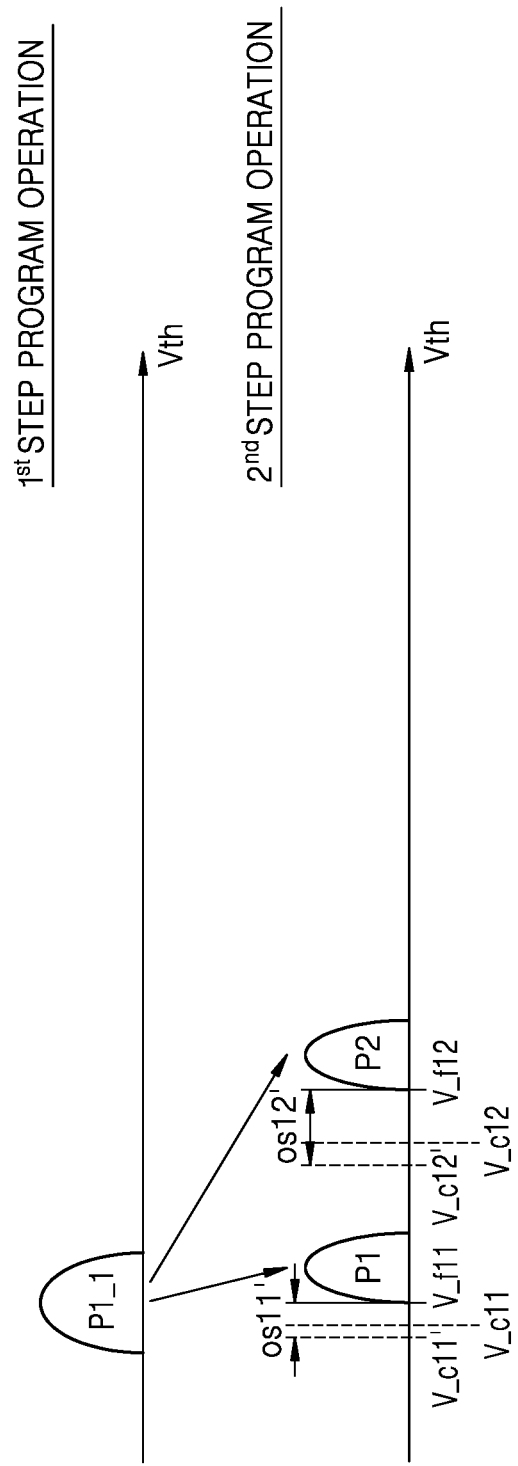

FIG. 16 is a flowchart illustrating an operation of a memory device updating offset information based on P/E cycle information in operation S310 of FIG. 15. FIGS. 17A and 17B are views illustrating an operation of updating offset information in accordance with a P/E cycle of a memory device.

Referring to FIG. 16, in operation S311, the memory device may receive the P/E cycle information representing the P/E cycle thereof from a memory controller. In some embodiments of the inventive concept, the memory device may directly manage the P/E cycle information. At this time, the P/E cycle information stored in the memory device may be read. In operation S312, the memory device may determine whether the P/E cycle exceeds a threshold value. When it is determined in operation S312 that the P/E cycle does not exceed the threshold value, operation S311 may be subsequently performed. When it is determined in operation S312 that the P/E cycle exceeds the threshold value, operation S313 may be subsequently performed so that the memory device may update the offset information.

Referring to FIG. 17A, memory cells of the memory device may have a first threshold voltage distribution D1 when the memory device reaches a first P/E cycle P/E Cycle1 and may have a second threshold voltage distribution D2 when the memory device reaches a second P/E cycle P/E Cycle2. As illustrated in FIG. 17A, as the P/E cycle increases, a cell speed of the memory cells of the memory device may increase; however, this is merely an example. In some embodiments of the inventive concept, as the P/E cycle increases, the cell speed of the memory cells of the memory device may be reduced.

Referring to FIG. 17B, it is assumed that the first offset os11 between the coarse verification voltage V_c11 and the fine verification voltage V_f11 for forming the first target threshold voltage distribution P1 from the first approximate threshold voltage distribution P1_1 and the second offset os12 between the coarse verification voltage V_c12 and the fine verification voltage V_f12 for forming the second target threshold voltage distribution P2 from the first approximate threshold voltage distribution P1_1 in FIG. 6A may be used under a condition of the first P/E cycle P/E Cycle1. Under a condition of the second P/E cycle P/E Cycle2, the memory device updates the first and second offsets os11 and os12 to be greater than previous ones and may form the first and second target threshold voltage distributions P1 and P2 by using updated first and second offsets os11' and os12'. FIG. 17B is merely an example embodiment. The inventive concept is not limited thereto and the offsets may be updated in various methods. As described above, the memory device may form optimal target threshold voltage distributions during a program operation by updating offset information in accordance with a change in characteristics of a memory cell.

Figure 18:
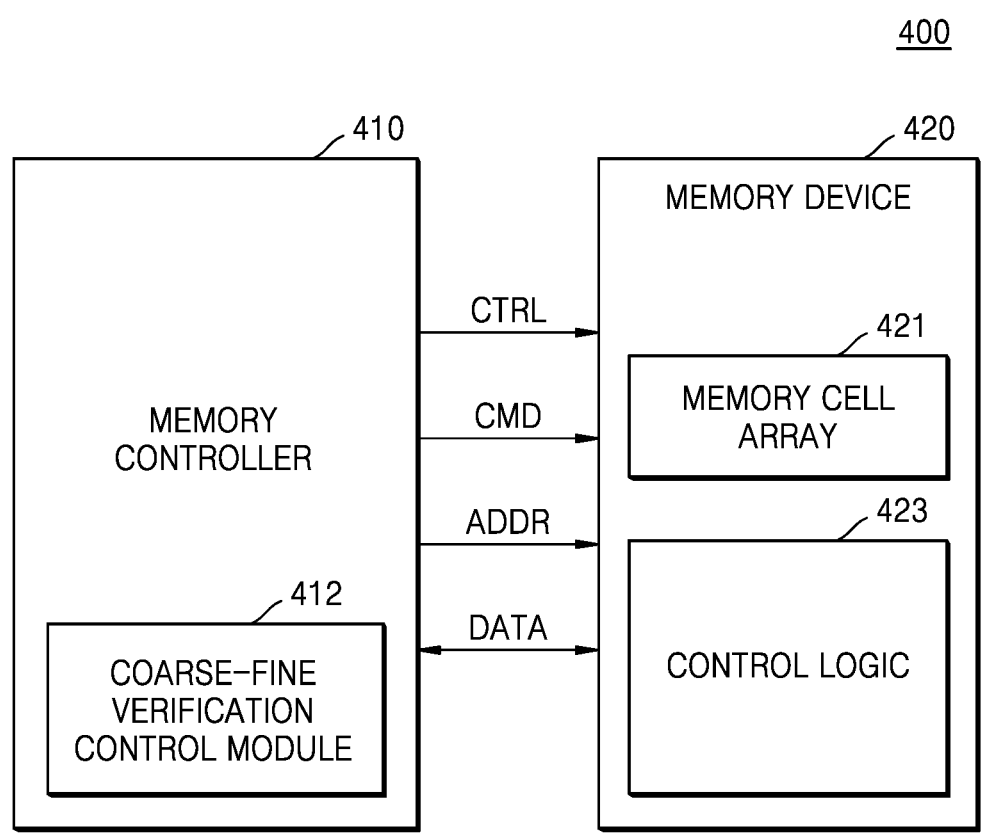
FIG. 18 is a block diagram illustrating a memory system according to an embodiment of the inventive concept.

FIG. 18 is a block diagram illustrating a memory system 400 according to an embodiment of the inventive concept. Hereinafter, the description previously given for overlapping elements with reference to FIG. 1 may be omitted.

Referring to FIG. 18, the memory system 400 may include a memory controller 410 and a memory device 420. The memory controller 410 may control the memory device 420 to read data items stored in the memory device 420 or to write data in the memory device 420 in response to a write/read request from a host. For example, the memory controller 410 may control a program or write, read, and erase operations for the memory device 420 by providing a command CMD, an address ADD, and a control signal CTRL to the memory device 420. In addition, data DATA to be written and read data DATA may be transmitted and received between the memory controller 410 and the memory device 420. The memory device 420 may include a memory cell array 421 and a control logic 423.

According to an embodiment of the inventive concept, the memory controller 410 may include a coarse-fine verification control module 412 and the coarse-fine verification control module 412 may control the second step program operation of the memory device 420 considering characteristics by target threshold voltage distributions. Embodiments of the inventive concept described with reference to FIGS. 1 to 17B may be applied to the coarse-fine verification control module 412.

Figure 19:
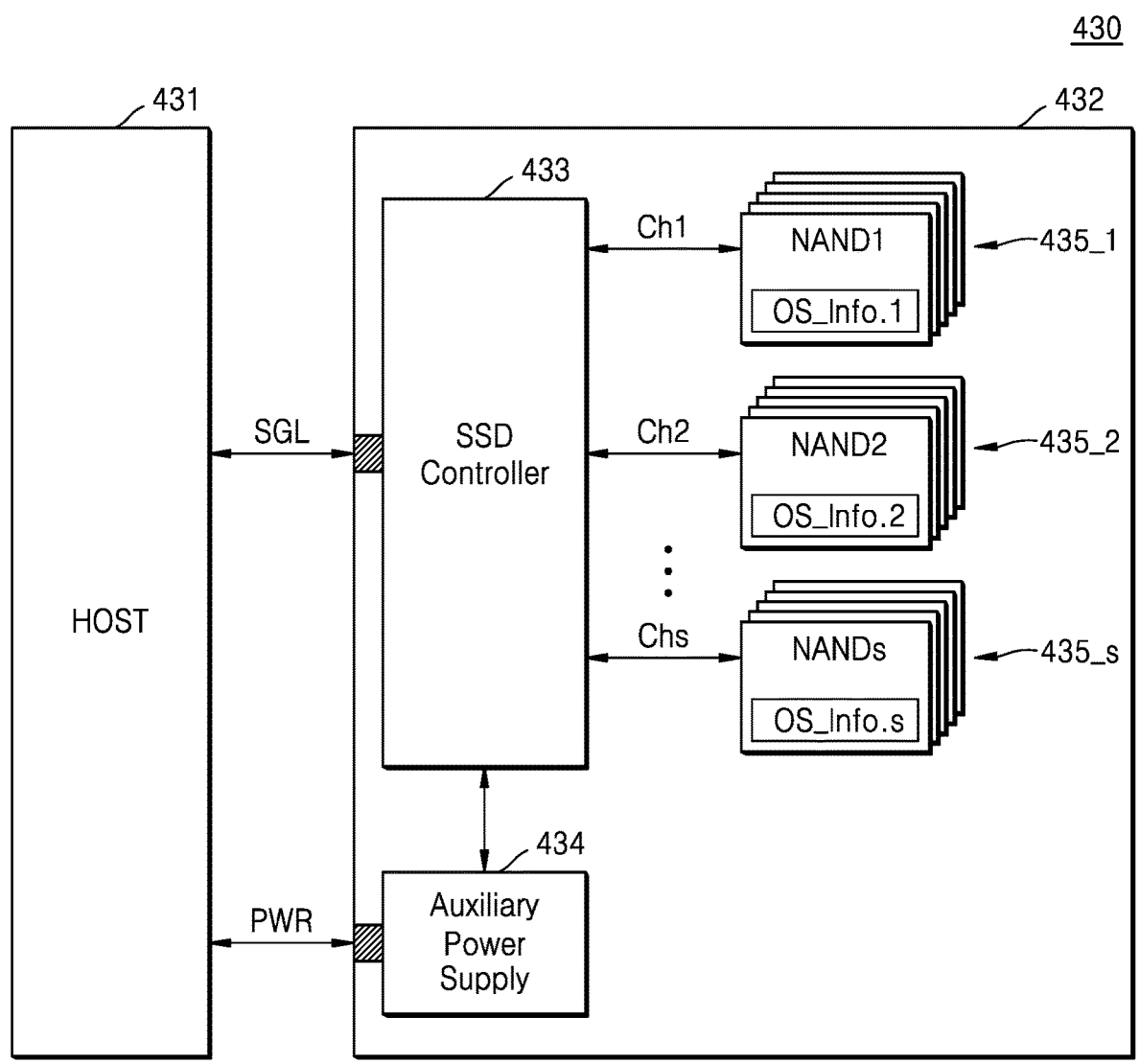
FIG. 19 is a block diagram illustrating a solid state drive (SSD) system according to an embodiment of the inventive concept.

FIG. 19 is a block diagram illustrating a solid state drive (SSD) system 430 according to an embodiment of the inventive concept.

Figure 20:
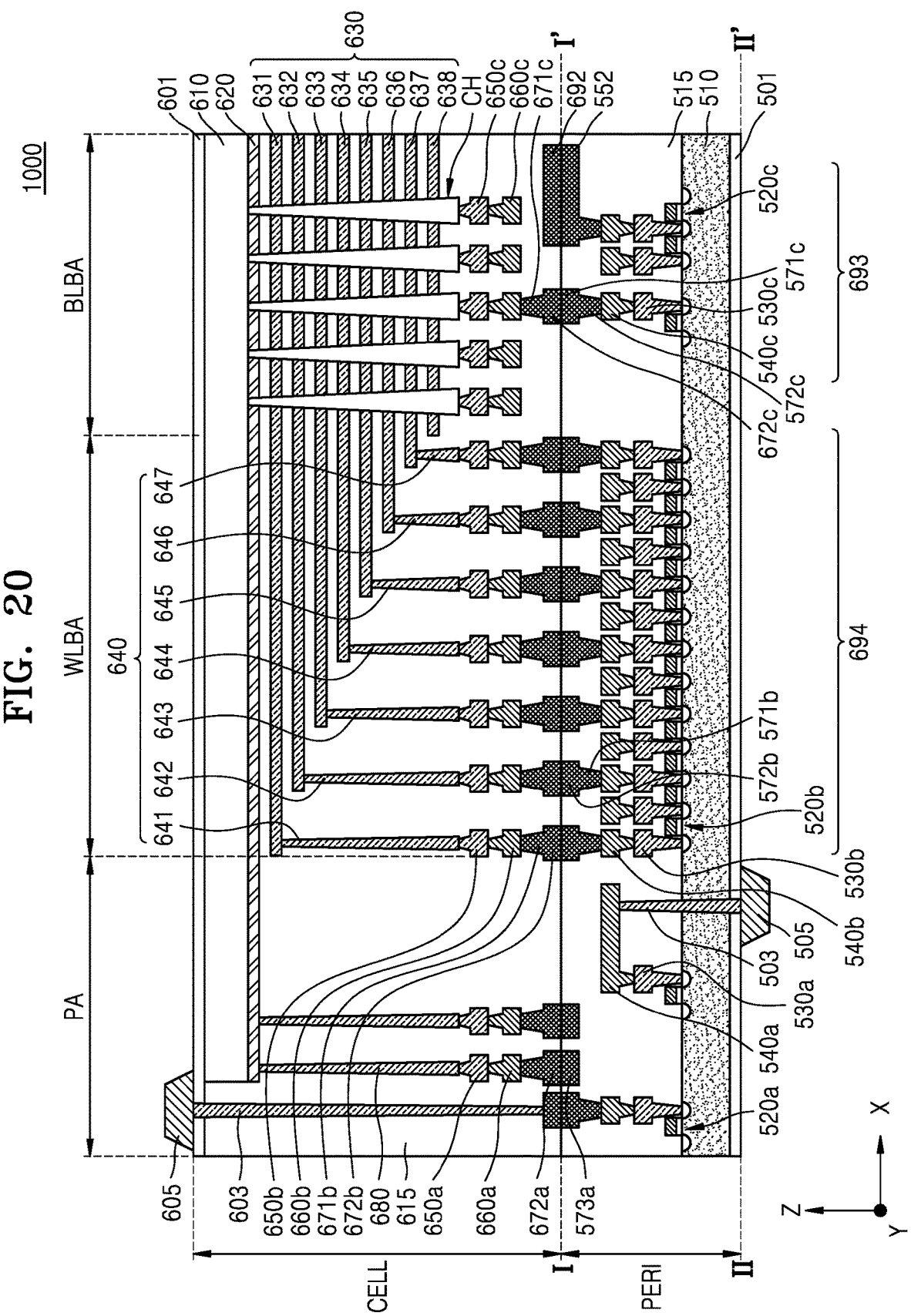
FIG. 20 is a view illustrating a chip to chip (C2C) structure applied to a memory device according to an embodiment of the inventive concept.

Referring to FIG. 19, the SSD system 430 may include a host 431 and an SSD 432. The SSD 432 may transmit and receive a signal to and from the host 431 through a signal connector and may receive power through a power connector. The SSD 432 may include an SSD controller 433, an auxiliary power supply 434, and first to sth memory devices 435_1 to 435_s. The embodiments described with reference to FIGS. 1 to 18 may be applied to the first to sth memory devices 435_1 to 435_s. The first to sth memory devices 435_1 to 435_s may respectively store first to sth offset information items OS_Info.1~OS_Info.s.s). The first to sth memory devices 435_1 to 435_s may perform the second step program operation by using the first to sth offset information items OS_Info.1~OS_Info.s.s). The host 431 and SSD 432 may communicate with each other via signal lines SGL and the host 431 may provide power to the SSD via power line PWR. The first to sth memory devices 435_1 to 435_s may be coupled to the SSD controller 433 via a plurality of channels Ch1 to CHs. FIG. 20 is a view illustrating a chip to chip (C2C) structure applied to a memory device 1000 according to an exemplary embodiment of the inventive concept. The memory device 1000 is an implementation of the memory device 100 of FIG. 1.

Referring to FIG. 20, the memory device 1000 may have a chip to chip (C2C) structure. In the C2C structure, after manufacturing an upper chip including a cell area CELL on a first wafer and manufacturing a lower chip including a peripheral circuit area PERI on a second wafer different from the first wafer, the upper chip and the lower chip are connected to each other in a bonding method. For example, in the bonding method, a bonding metal formed in the uppermost metal layer of the upper chip is electrically connected to a bonding metal formed in the uppermost metal layer of the lower chip. For example, when the bonding metal includes copper (Cu), the bonding method may be a Cu—Cu bonding method and the bonding metal may include aluminum (Al) or tungsten (W).

Each of the peripheral circuit area PERI and the cell area CELL of the memory device 1000 may include an external pad bonding area PA, a word line bonding area WLBA, and a bit line bonding area BLBA.

The peripheral circuit area PERI may include a first substrate 510, an interlayer insulating layer 515, a plurality of circuit elements 520a, 520b, and 520c formed on the first substrate 510, first metal layers 530a, 530b, and 530c respectively connected to the plurality of circuit elements 520a, 520b, and 520c, and second metal layers 540a, 540b, and 540c formed on the first metal layers 530a, 530b, and 530c. In an embodiment of the inventive concept, the first metal layers 530a, 530b, and 530c may include W having high resistance and the second metal layers 540a, 540b, and 540c may include Cu having low resistance.

In FIG. 20, only the first metal layers 530a, 530b, and 530c and the second metal layers 540a, 540b, and 540c are illustrated and described. However, the inventive concept is not limited thereto, and at least one metal layer may be further formed on the second metal layers 540a, 540b, and 540c. At least a part of the at least one metal layer formed on the second metal layers 540a, 540b, and 540c may include Al having lower resistance than Cu that the second metal layers 540a, 540b, and 540c include.

The interlayer insulating layer 515 may be arranged on the first substrate 510 to cover the plurality of circuit elements 520a, 520b, and 520c, the first metal layers 530a, 530b, and 530c, and the second metal layers 540a, 540b, and 540c and may include an insulating material such as silicon oxide or silicon nitride Lower bonding metals 571b and 572b may be formed on the second metal layer 540b of the word line bonding area WLBA. In the word line bonding area WLBA, the lower bonding metals 571b and 572b of the peripheral circuit area PERI may be electrically connected to upper bonding metals 671b and 672b of the cell area CELL in a bonding method and the lower bonding metals 571b and 572b and the upper bonding metals 671b and 672b may include Al, Cu, or W.

The cell area CELL may provide at least one memory block. The cell area CELL may include a second substrate 610 and a common source line 620. A plurality of word lines 631 to 638 (630) may be stacked on the second substrate 610 in a direction (a Z axis direction) perpendicular to an upper surface of the second substrate 610. String selection lines may be arranged on the plurality of word lines 631 to 638 and a ground selection line may be arranged under the plurality of word lines 631 to 638 and the plurality of word lines 631 to 638 may be arranged between the string selection lines and the ground selection line.

In the bit line bonding area BLBA, a channel structure CH may extend in the direction perpendicular to the upper surface of the second substrate 610 and may pass through the plurality of word lines 631 to 638, the string selection lines, and the ground selection line. The channel structure CH may include a data storage layer, a channel layer, and a buried insulation layer and the channel layer may be electrically connected to a first metal layer 650c and a second metal layer 660c. For example, the first metal layer 650c may be a bit line contact and the second metal layer 660c may be a bit line. In an embodiment of the inventive concept, the second metal layer 660c may extend in a first direction (a Y direction) parallel with the upper surface of the second substrate 610.

In the embodiment illustrated in FIG. 20, an area in which the channel structure CH and the second metal layer 660c are arranged may be referred to as the bit line bonding area BLBA. The second metal layer 660c in the bit line bonding area BLBA may be electrically connected to circuit elements 520c included in a page buffer 693 in the peripheral circuit area PERI. For example, the second metal layer 660c may be connected to upper bonding metals 671c and 672c in the peripheral circuit area PERI and the upper bonding metals 671c and 672c may be connected to lower bonding metals 571c and 572c connected to the circuit elements 520c of the page buffer 693.

In the word line bonding area WLBA, the plurality of word lines 631 to 638 may extend in a second direction (an X axis direction) parallel with the upper surface of the second substrate 610 and may be connected to a plurality of cell contact plugs 641 to 647 (640). The plurality of word lines 631 to 638 may be connected to the plurality of cell contact plugs 641 to 647 in pads in which at least some of the plurality of word lines 631 to 638 extend with different lengths. A first metal layer 650b and a second metal layer 660b may be sequentially connected onto the plurality of cell contact plugs 641 to 647 connected to the plurality of word lines 631 to 638. The plurality of cell contact plugs 641 to 647 may be connected to the peripheral circuit area PERI through the upper bonding metals 671b and 672b of the cell area CELL and the lower bonding metals 571b and 572b of the peripheral circuit area PERI in the word line bonding area WLBA.

The plurality of cell contact plugs 641 to 647 may be electrically connected to the circuit elements 520b included in a row decoder 694 in the peripheral circuit area PERI. In an embodiment of the inventive concept, an operation voltage of the circuit elements 520b included in the row decoder 694 may be different from an operation voltage of the circuit elements 520c included in the page buffer 693. For example, the operation voltage of the circuit elements 520c included in the page buffer 693 may be greater than the operation voltage of the circuit elements 520b included in the row decoder 694.

In an external pad bonding area PA, a common source line contact plug 680 may be arranged. The common source line contact plug 680 may include a conductive material such as a metal, a metal compound, or polysilicon and may be electrically connected to the common source line 620. On the common source line contact plug 680, a first metal layer 650a and a second metal layer 660a may be sequentially stacked. For example, an area in which the common source line contact plug 680, the first metal layer 650a, and the second metal layer 660a are arranged may be referred to as the external pad bonding area PA.

In addition, first and second input and output pads 505 and 605 may be arranged in the external pad bonding area PA. A lower insulating layer 501 covering a lower surface of the first substrate 510 may be formed under the first substrate 510 and the first input and output pad 505 may be formed on the lower insulating layer 501. The first input and output pad 505 may be connected to at least one of the plurality of circuit elements 520a, 520b, and 520c arranged in the peripheral circuit area PERI through a first input and output contact plug 503 and may be separated from the first substrate 510 by the lower insulating layer 501. In addition, between the first input and output contact plug 503 and the first substrate 510, a side insulating layer may be arranged to electrically isolate the first input and output contact plug 503 from the first substrate 510.

An upper insulating layer 601 covering the upper surface of the second substrate 610 may be formed on the second substrate 610 and a second input and output pad 605 may be arranged on the upper insulating layer 601. The second input and output pad 605 may be connected to at least one of the plurality of circuit elements 520a, 520b, and 520c arranged in the peripheral circuit area PERI through a second input and output contact plug 603.

According to embodiments of the inventive concept, in an area in which the second input and output contact plug 603 is arranged, the second substrate 610 and the common source line 620 may not be arranged. In addition, the second input and output pad 605 may not overlap the plurality of word lines 631 to 638 in a third direction (the Z axis direction). The plurality of word lines 631 to 638 may be separated from the second substrate 610 in a direction parallel with the upper substrate of the second substrate 610 and may be connected to the second input and output pad 605 through an interlayer insulating layer 615 of the cell area CELL.

According to embodiments of the inventive concept, the first input and output pad 505 and the second input and output pad 605 may be selectively formed. For example, the memory device 1000 may include only the first input and output pad 505 arranged on the first substrate 501 or the second input and output pad 605 arranged on the second substrate 601. Alternatively, the memory device 1000 may include both the first input and output pad 505 and the second input and output pad 605.

In the external pad bonding area PA and the bit line bonding area BLBA respectively included in the cell area CELL and the peripheral circuit area PERI, a metal pattern of the uppermost metal layer is provided as a dummy pattern or the uppermost metal layer may be empty.

In the external pad bonding area PA of the memory device 1000, to correspond to an upper metal pattern 672a formed in the uppermost metal layer of the cell area CELL, a lower metal pattern 573a in the same form as the upper metal pattern 672a of the cell area CELL may be formed in the uppermost metal layer of the peripheral circuit area PERI. The lower metal pattern 573a formed in the uppermost metal layer of the peripheral circuit area PERI may not be connected to an additional contact in the peripheral circuit area PERI. Similarly, in the external pad bonding area PA, to correspond to the lower metal pattern formed in the uppermost metal layer of the peripheral circuit area PERI, an upper metal pattern in the same form as the lower metal pattern of the peripheral circuit area PERI may be formed in the upper metal layer of the cell area CELL.

On the second metal layer 540b of the word line bonding area WLBA, the lower bonding metals 571b and 572b may be formed. In the word line bonding area WLBA, the lower bonding metals 571b and 572b of the peripheral circuit area PERI may be electrically connected to the upper bonding metals 671b and 672b of the cell area CELL.

In addition, in the bit line bonding area BLBA, to correspond to a lower metal pattern 552 formed in the uppermost metal layer of the peripheral circuit area PERI, an upper metal pattern 692 in the same form as the lower metal pattern 552 of the peripheral circuit area PERI may be formed in the uppermost metal layer of the cell area CELL. On the upper metal pattern 692 formed in the uppermost metal layer of the cell area CELL, a contact may not be formed.

While the inventive concept has been particularly shown and described with reference to embodiments thereof, it will be understood that various changes in form and details may be made therein without departing from the spirit and scope of the following claims.

What is claimed is:

1. A method of operating a memory device, the method comprising:
    performing a first program operation to form a plurality of first threshold voltage distributions; and
    performing a second program operation by using a coarse verification voltage and a fine verification voltage based on offset information to form a plurality of second threshold voltage distributions respectively corresponding to a plurality of program states from the plurality of first threshold voltage distributions, wherein the offset information includes a plurality of offsets that vary according to distribution speed-related characteristics of the second threshold voltage distributions,
    wherein the plurality of program states comprise a first program state and a second program state,
    wherein the plurality of second threshold voltage distributions comprise a first target threshold voltage distribution corresponding to the first program state and a second target threshold voltage distribution corresponding to the second program state,
    wherein the plurality of offsets comprise a first offset between the coarse verification voltage and the fine verification voltage used for forming the first target threshold voltage distribution and a second offset between the coarse verification voltage and the fine verification voltage used for forming the second target threshold voltage distribution,
    wherein a threshold voltage increase of the second target threshold voltage distribution from a first threshold voltage distribution is greater than a threshold voltage increase of the first target threshold voltage distribution from the first threshold voltage distribution in the second program operation, wherein the second offset is greater than the first offset,
wherein the first offset comprises a first voltage difference between the coarse verification voltage and the fine verification voltage used for forming the first target threshold voltage distribution,
wherein the second offset comprises a second voltage difference between the coarse verification voltage and the fine verification voltage used for forming the second target threshold voltage distribution, and
wherein the second voltage difference is greater than the first voltage difference.

2. The method of claim 1, wherein the characteristics of the second threshold voltage distributions are related to estimated threshold voltage increases from the plurality of first threshold voltage distributions respectively corresponding to the plurality of second threshold voltage distributions in the second program operation.

3. The method of claim 1, wherein the plurality of offsets are related to at least one of a level difference between the coarse verification voltage and the fine verification voltage and a length difference between a first develop interval using the coarse verification voltage and a second develop interval using the fine verification voltage.

4. The method of claim 1, wherein a number of first threshold voltage distributions is less than a number of second threshold voltage distributions.

5. The method of claim 1, wherein the memory device comprises a plurality of memory cells on which the first and second program operations are to be performed, and
wherein each of the plurality of memory cells corresponds to at least one of a multilevel cell, a triple level cell, and a quadruple level cell.

6. The method of claim 1, wherein the first and second program operations are based on a high speed program method.

7. The method of claim 1, further comprising:
receiving operation condition information of the memory device from a memory controller; and
updating the offset information based on the operation condition information of the memory device.

8. A memory device, comprising:
a memory cell array including a plurality of memory cells; and
a control logic controlling a first program operation for the plurality of memory cells to form a plurality of first threshold voltage distributions and controlling a second program operation for the plurality of memory cells to form a plurality of second threshold voltage distributions respectively corresponding to a plurality of program states,
wherein the control logic controls the second program operation by using a plurality of offsets between a coarse verification voltage and a fine verification voltage, which vary in accordance with distribution speed-related characteristics of the second threshold voltage distributions,
wherein a number of first threshold voltage distributions is less than a number of second threshold voltage distributions,
wherein the plurality of second threshold voltage distributions include a first target threshold voltage distribution corresponding to a first program state and a second target threshold voltage distribution corresponding to a second program state,
wherein the plurality of offsets comprise a first offset between the coarse verification voltage and the fine verification voltage used for forming the first target threshold voltage distribution and a second offset between the coarse verification voltage and the fine verification voltage used for forming the second target threshold voltage distribution,
wherein a threshold voltage increase of the second target threshold voltage distribution from a first threshold voltage distribution is greater than a threshold voltage increase of the first target threshold voltage distribution from the first threshold voltage distribution in the second program operation,
wherein the second offset is greater than the first offset,
wherein the first offset comprises a first voltage difference between the coarse verification voltage and the fine verification voltage used for forming the first target threshold voltage distribution,
wherein the second offset comprises a second voltage difference between the coarse verification voltage and the fine verification voltage used for forming the second target threshold voltage distribution, and
wherein the second voltage difference is greater than the first voltage difference.

9. The memory device of claim 8, wherein the offsets are related to a level difference between the coarse verification voltage and the fine verification voltage,
wherein the memory device further comprises a voltage generator generating the coarse verification voltage and the fine verification voltage, and
wherein the control logic controls the voltage generator to control the level difference in accordance with the characteristics of the second threshold voltage distributions.

10. The memory device of claim 8, wherein the memory cell array further comprises a redundant cell region in which the plurality of offsets are stored.

11. A memory system, comprising:
a plurality of memory devices; and
a memory controller controlling operations of the plurality of memory devices,
wherein each of the plurality of memory devices forms a plurality of first threshold voltage distributions by performing a first step program operation in response to a program command from the memory controller and forms a plurality of second threshold voltage distributions respectively corresponding to a plurality of program states by performing a second step program operation by using a coarse verification voltage and a fine verification voltage having different offsets in accordance with distribution speed-related characteristics of the second threshold voltage distributions,
wherein the second threshold voltage distributions include a first target threshold voltage distribution corresponding to a first program state and a second target threshold voltage distribution corresponding to a second program state,
wherein the offsets comprise a first offset between the coarse verification voltage and the fine verification voltage used to form the first target threshold voltage distribution and a second offset between the coarse verification voltage and the fine verification voltage used to form the second target threshold voltage distribution,
wherein a threshold voltage increase of the second target threshold voltage distribution from a first threshold voltage distribution is greater than a threshold voltage increase of the first target threshold voltage distribution from the first threshold voltage distribution in the second step program operation, wherein the first offset is smaller than the second offset,
wherein the first offset comprises a first voltage difference between the coarse verification voltage and the fine verification voltage used for forming the first target threshold voltage distribution,
wherein the second offset comprises a second voltage difference between the coarse verification voltage and the fine verification voltage used for forming the second target threshold voltage distribution, and
wherein the second voltage difference is greater than the first voltage difference.

12. The memory system of claim 11, wherein each of the plurality of memory devices stores offset information on the first and second offsets and performs the second step program operation based on the offset information.

* * * * *